US012069822B2

(12) United States Patent
Ahn et al.

(10) Patent No.: US 12,069,822 B2
(45) Date of Patent: Aug. 20, 2024

(54) PANEL SUPPORT AND DISPLAY DEVICE INCLUDING THE SAME

(71) Applicant: SAMSUNG DISPLAY CO., LTD., Yongin-si (KR)

(72) Inventors: Sung Sang Ahn, Hwaseong-si (KR); Tae Chang Kim, Anyang-si (KR); Tae Hoon Yang, Yongin-si (KR); Jung Hun Lee, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 22 days.

(21) Appl. No.: 17/813,921

(22) Filed: Jul. 20, 2022

(65) Prior Publication Data

US 2023/0180403 A1 Jun. 8, 2023

(30) Foreign Application Priority Data

Dec. 7, 2021 (KR) .......................... 10-2021-0173958

(51) Int. Cl.
*H05K 5/02* (2006.01)
*H05K 5/00* (2006.01)

(52) U.S. Cl.
CPC ......... *H05K 5/0217* (2013.01); *H05K 5/0018* (2022.08)

(58) Field of Classification Search
CPC ... H05K 5/0217; H05K 5/0018; G06F 1/1652
See application file for complete search history.

(56) References Cited

U.S. PATENT DOCUMENTS

| 10,185,367 | B2* | 1/2019 | Kim | ........................ G06F 1/1652 |
| 11,029,733 | B2* | 6/2021 | Lee | ........................ G06F 1/1652 |
| 11,227,516 | B1* | 1/2022 | Shin | ........................... G09F 9/30 |
| 2017/0142848 | A1* | 5/2017 | Yeo | ........................ H05K 5/0217 |
| 2018/0102072 | A1* | 4/2018 | Lee | ........................ G02F 1/133305 |
| 2020/0135064 | A1* | 4/2020 | Lee | ........................ G06F 1/1652 |
| 2020/0253069 | A1* | 8/2020 | Cha | ........................ G06F 1/1681 |
| 2020/0267247 | A1* | 8/2020 | Song | ........................ H04M 1/0237 |
| 2020/0348727 | A1* | 11/2020 | Lee | ........................ G06F 1/1624 |
| 2021/0076511 | A1* | 3/2021 | Yang | ........................ G09F 9/301 |

(Continued)

FOREIGN PATENT DOCUMENTS

| KR | 10-2016-0141255 | 12/2016 |
| KR | 10-2020-0052621 | 5/2020 |
| KR | 10-2020-0099054 | 8/2020 |

(Continued)

*Primary Examiner* — Sagar Shrestha
(74) *Attorney, Agent, or Firm* — F. Chau & Associates, LLC

(57) ABSTRACT

A display device includes a display panel sliding in a first direction. A panel storage compartment is configured to accommodate the display panel therein and to assist a sliding operation of the display panel in the first direction. A plurality of segments are attached to a lower surface of the display panel, each of the plurality of segments are extended in a second direction intersecting the first direction, and are spaced apart from one another in the first direction. Bearings are disposed inside the plurality of segments and are at least partially exposed by the plurality of segments. The panel storage compartment includes guide rails engaged with the bearings.

13 Claims, 27 Drawing Sheets

(56) References Cited

U.S. PATENT DOCUMENTS

2023/0164248 A1\* 5/2023 Park .................... H04M 1/0237
　　　　　　　　　　　　　　　　　　　　　455/575.4
2023/0337379 A1\* 10/2023 Dong ...................... F16C 11/04

FOREIGN PATENT DOCUMENTS

| KR | 10-2021-0007773 | 1/2021 |
| KR | 10-2021-0083442 | 7/2021 |

\* cited by examiner

[Fig. 1]
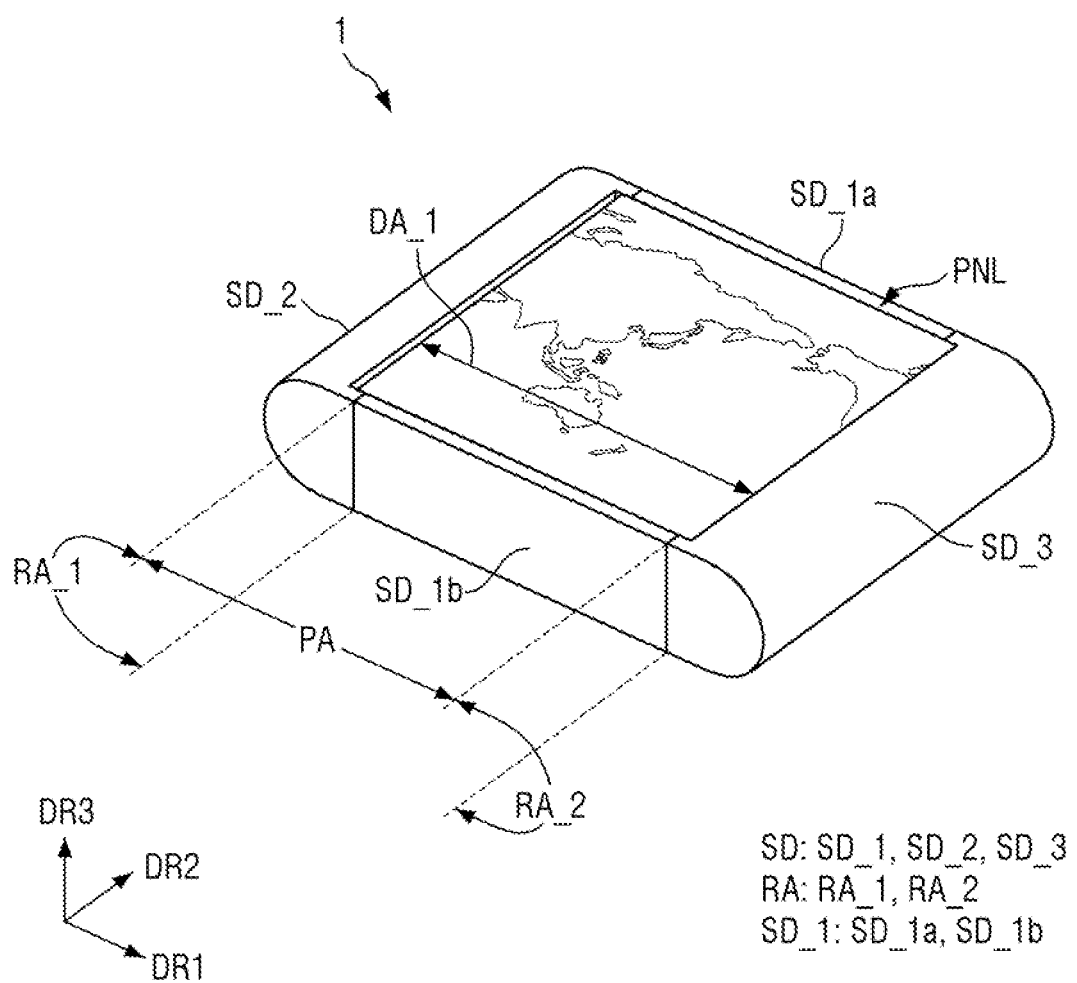

[Fig. 2]
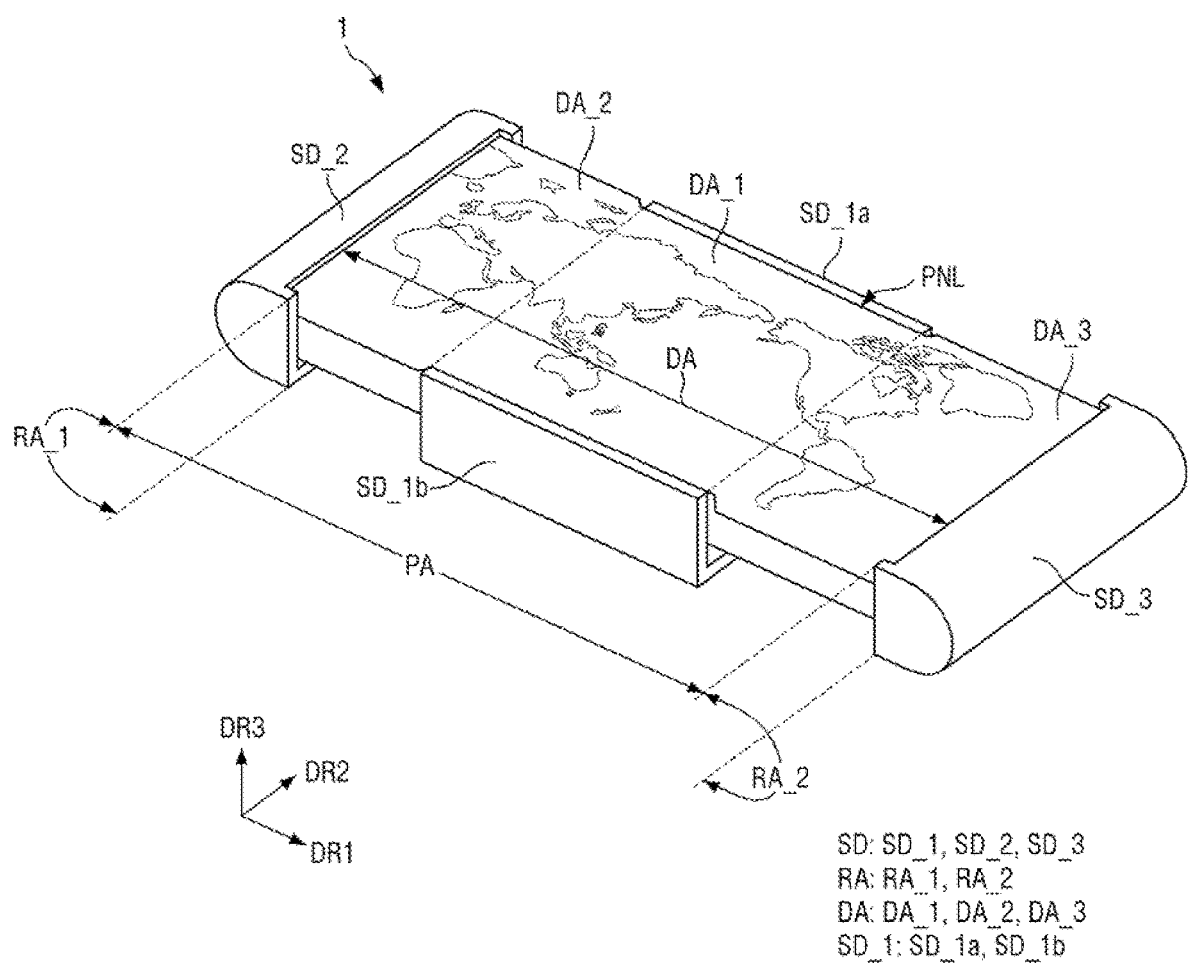

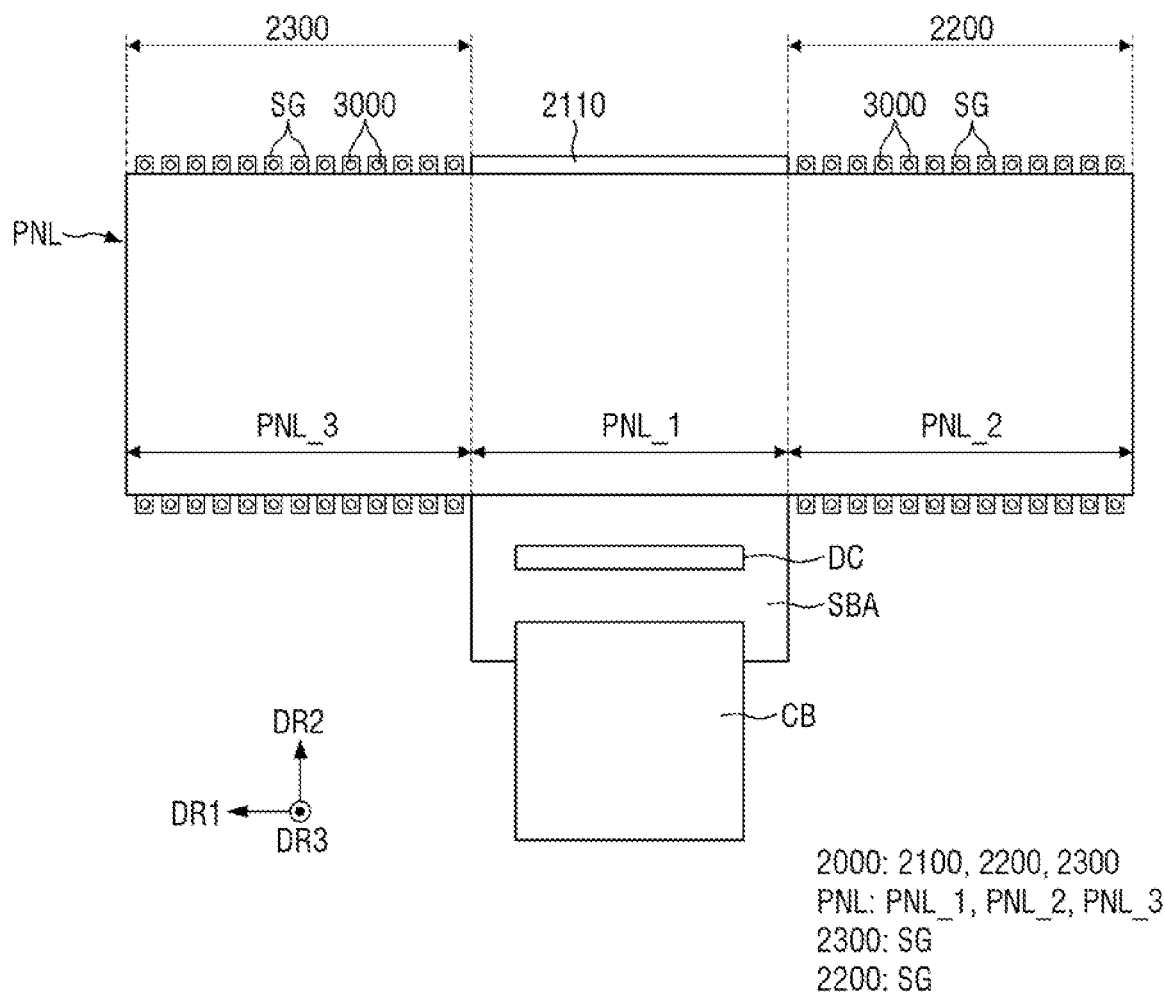
[Fig. 3]

[Fig. 4]
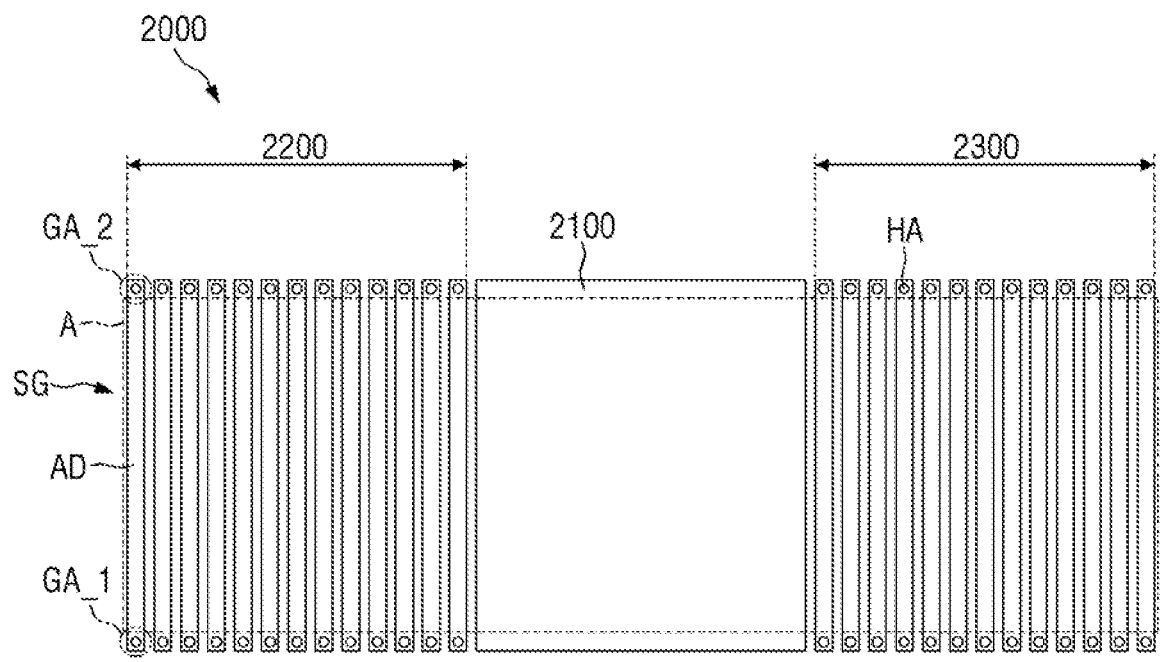

[Fig. 5]
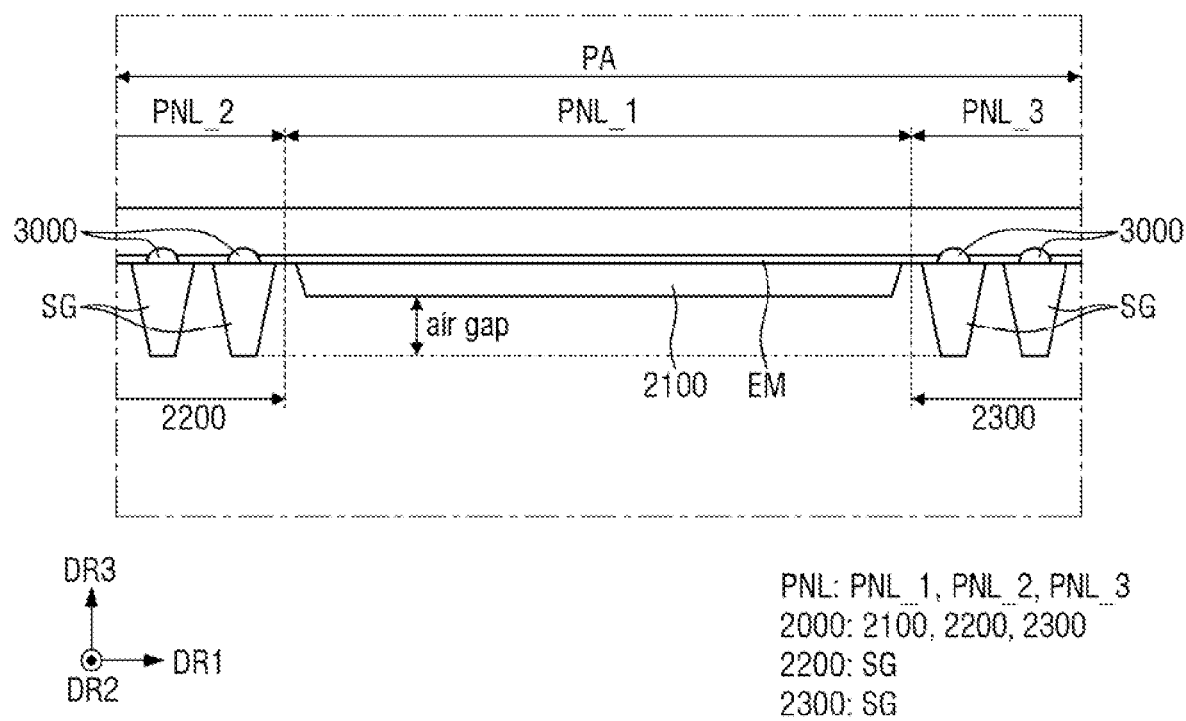

[Fig. 6]
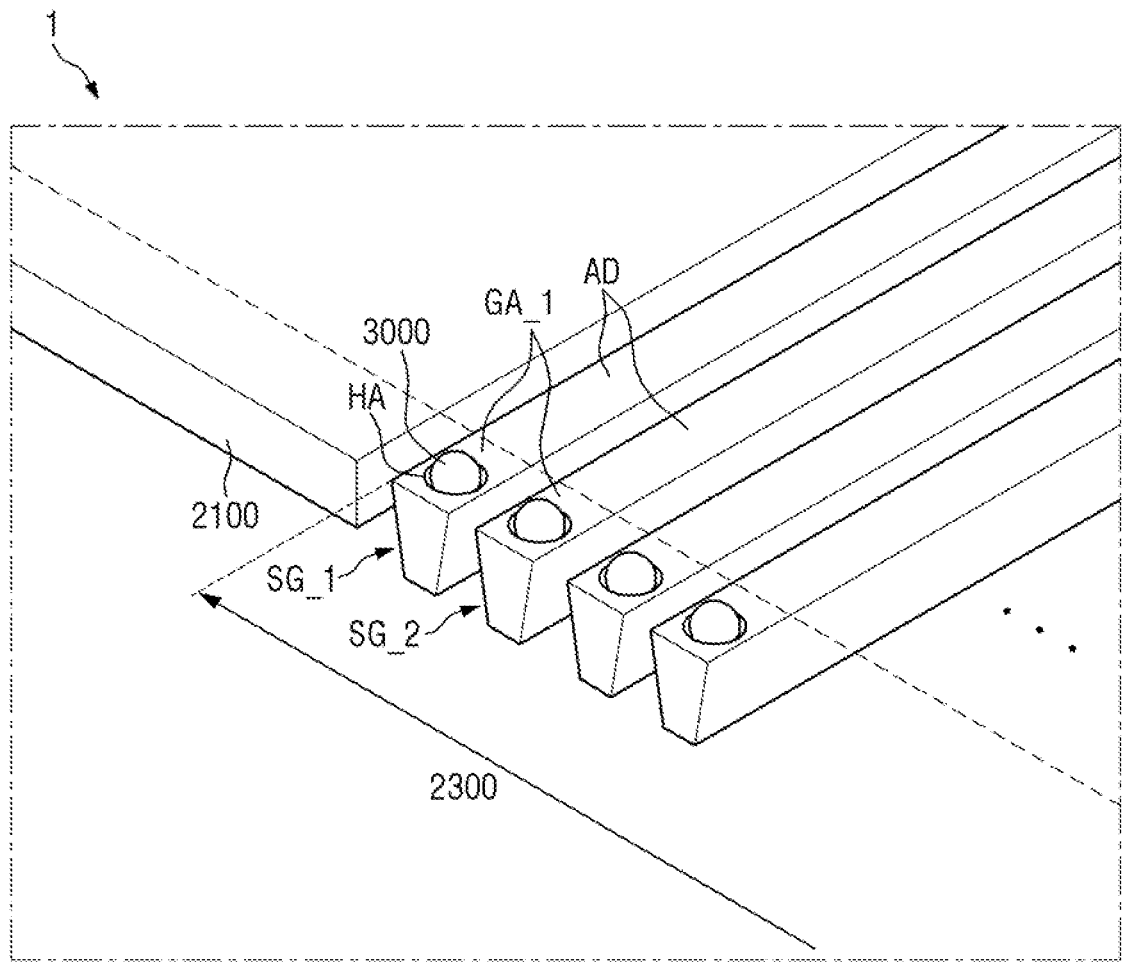
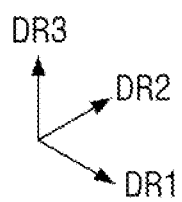
SG: SG_1, SG_2
SG_1: GA_1, AD
SG_2: GA_1, AD
GA_1: HA

[Fig. 7]
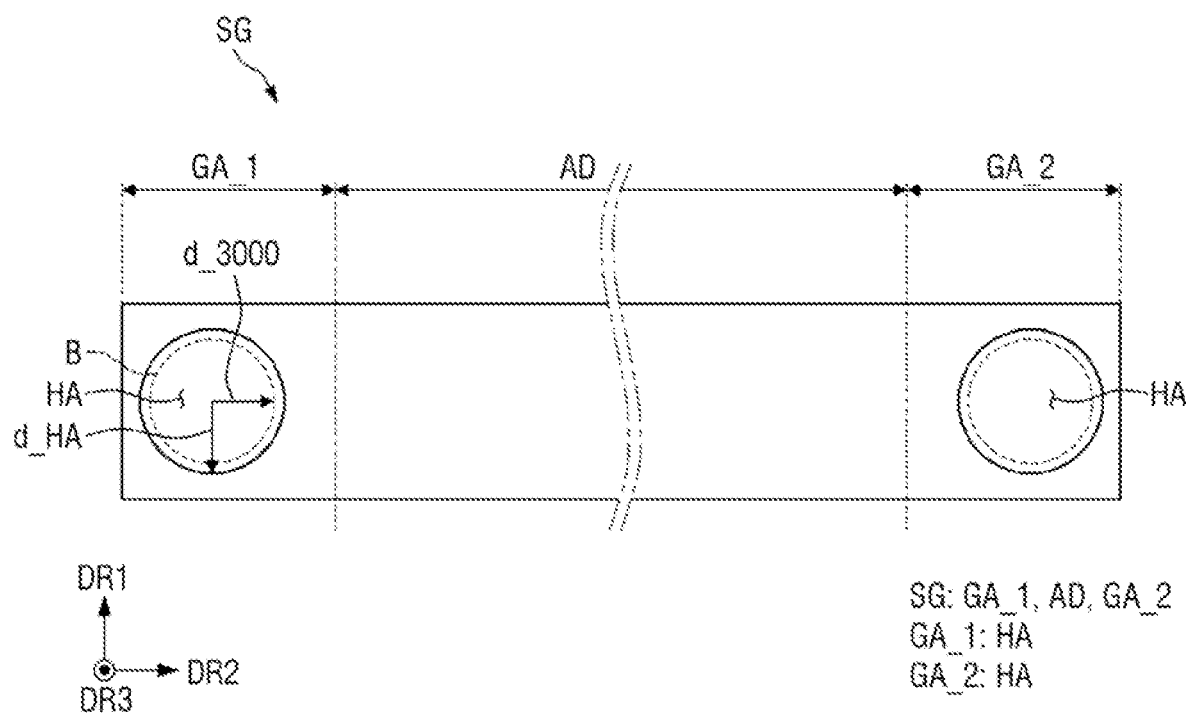

[Fig. 8]
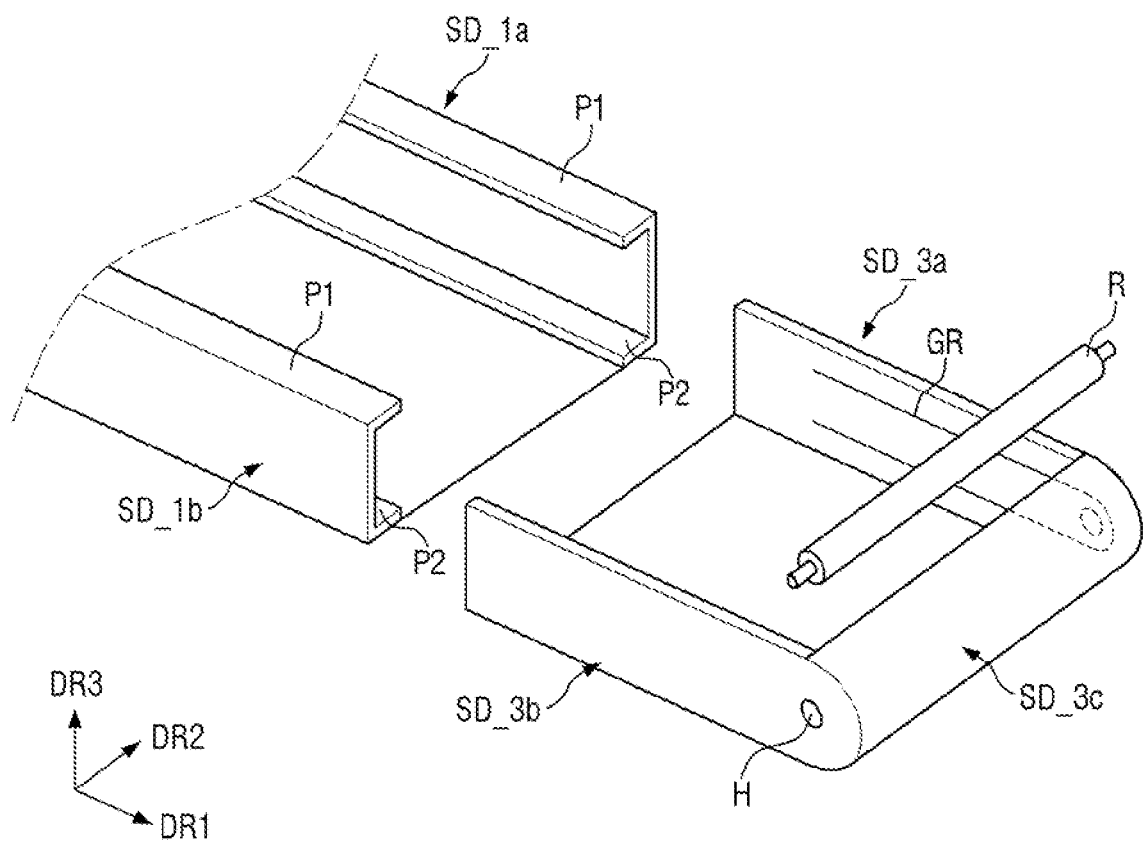

[Fig. 9]
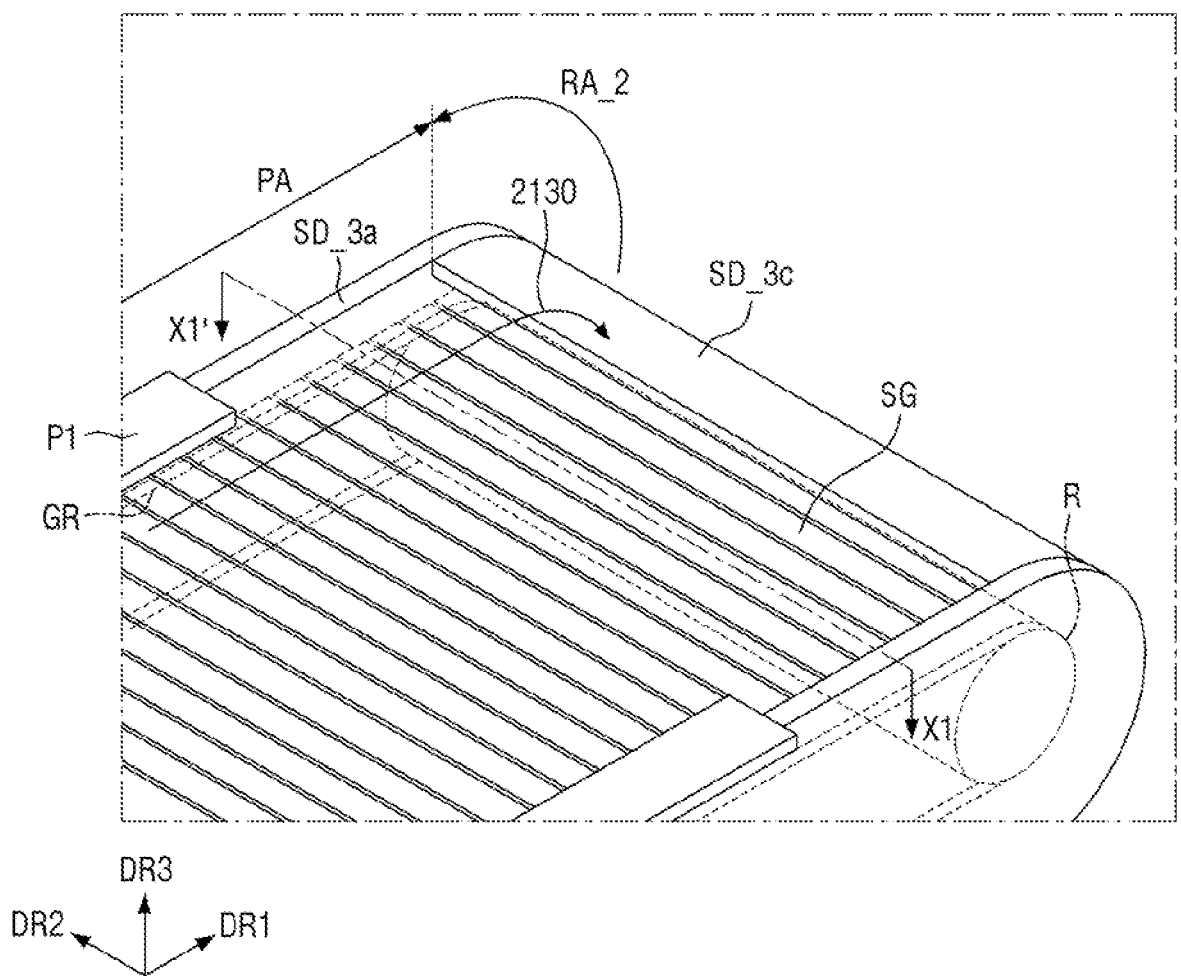

[Fig. 10]
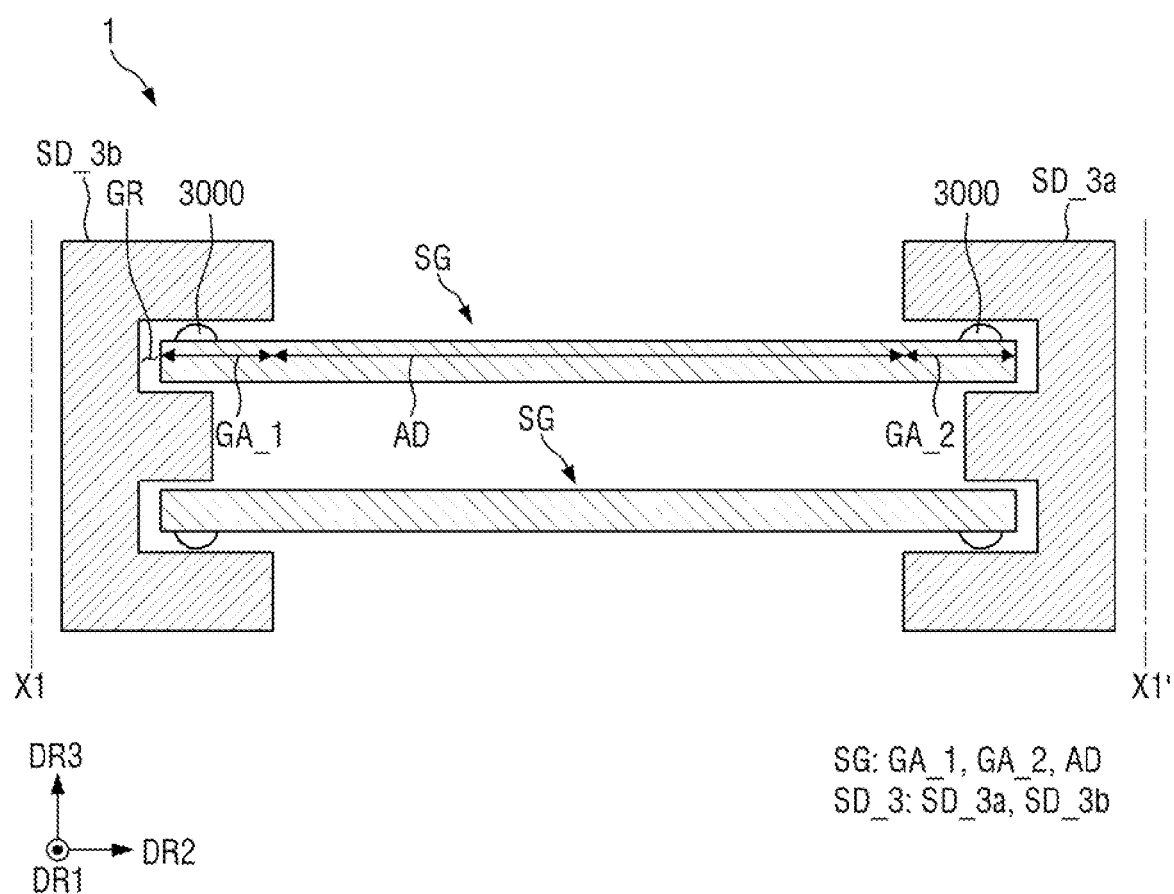

[Fig. 11]
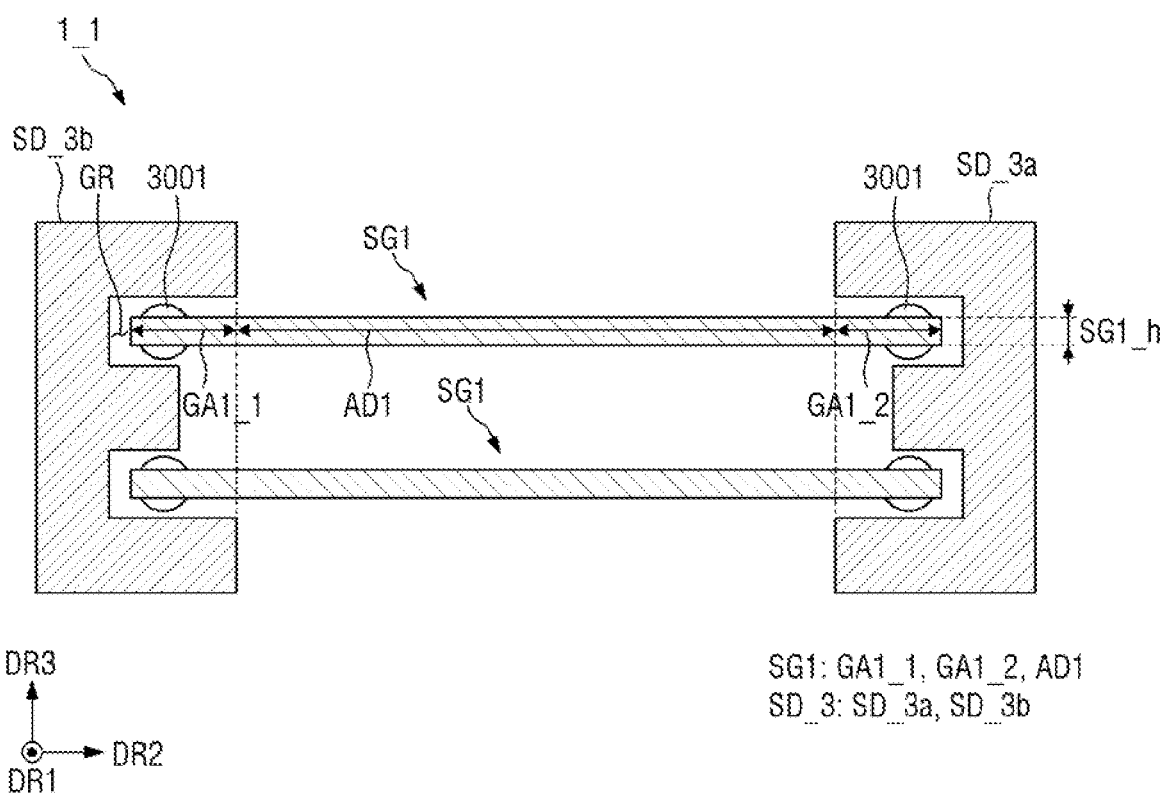

[Fig. 12]
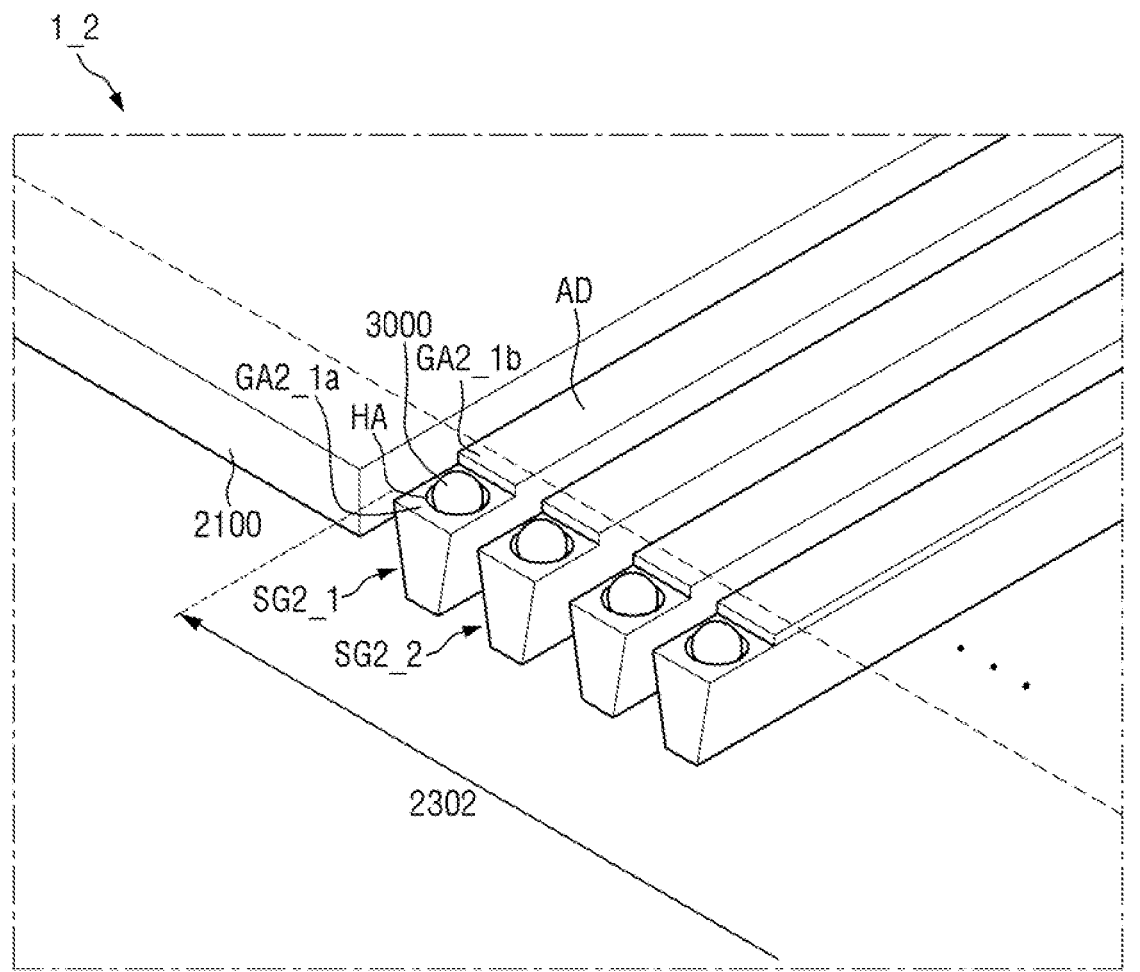
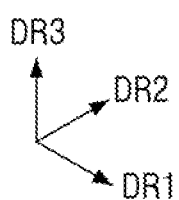
SG2: SG2_1, SG2_2
SG2_1: GA2_1, AD
SG2_2: GA2_1, AD
GA_2: HA

[Fig. 13]
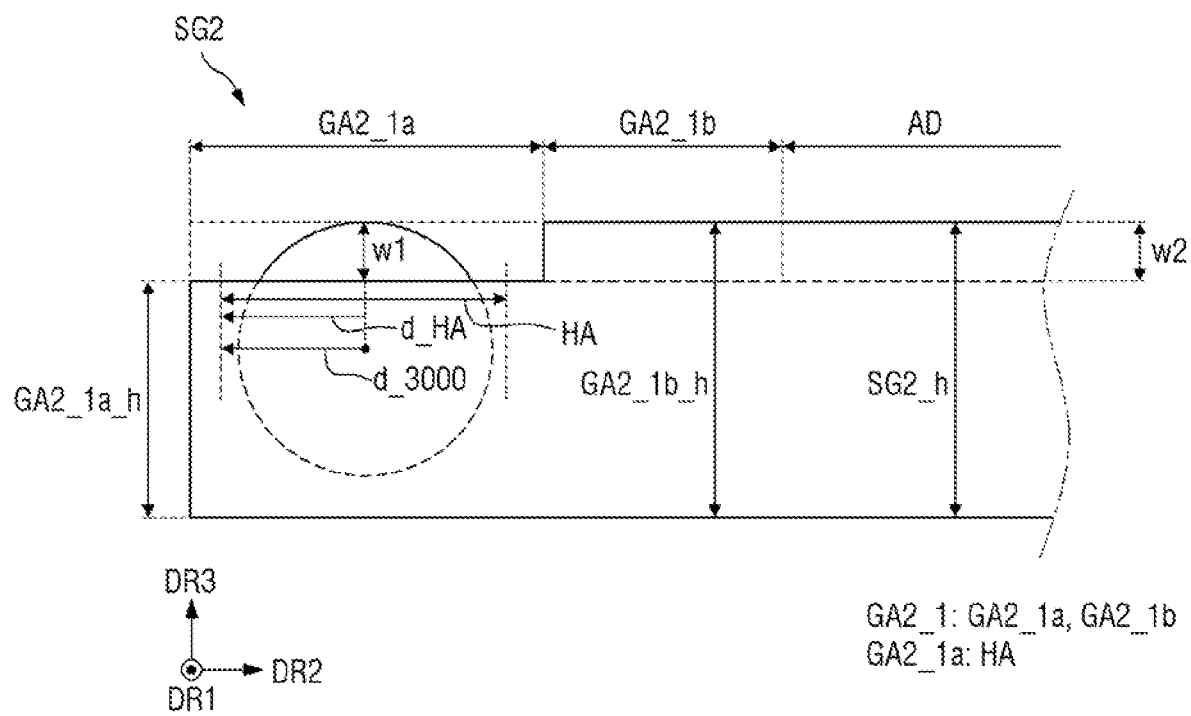

[Fig. 14]
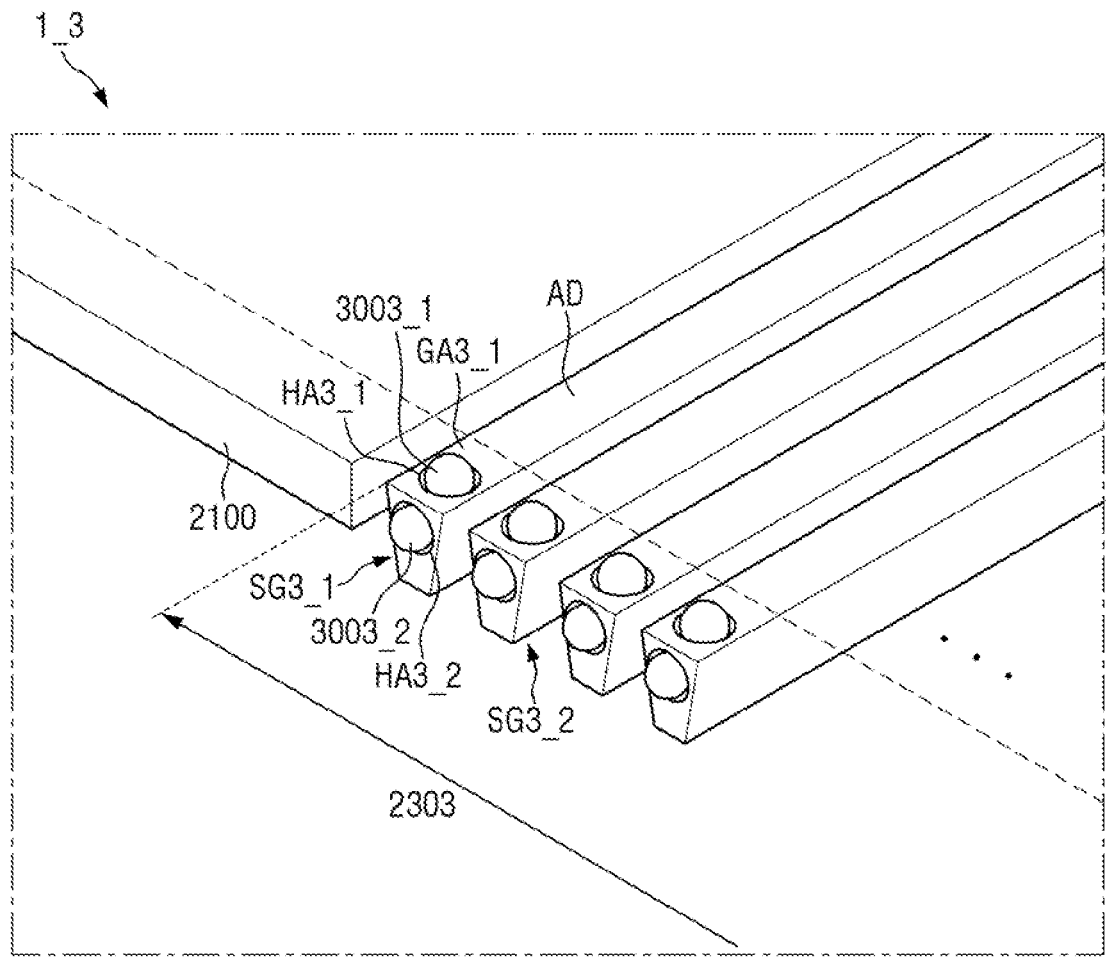

[Fig. 15]
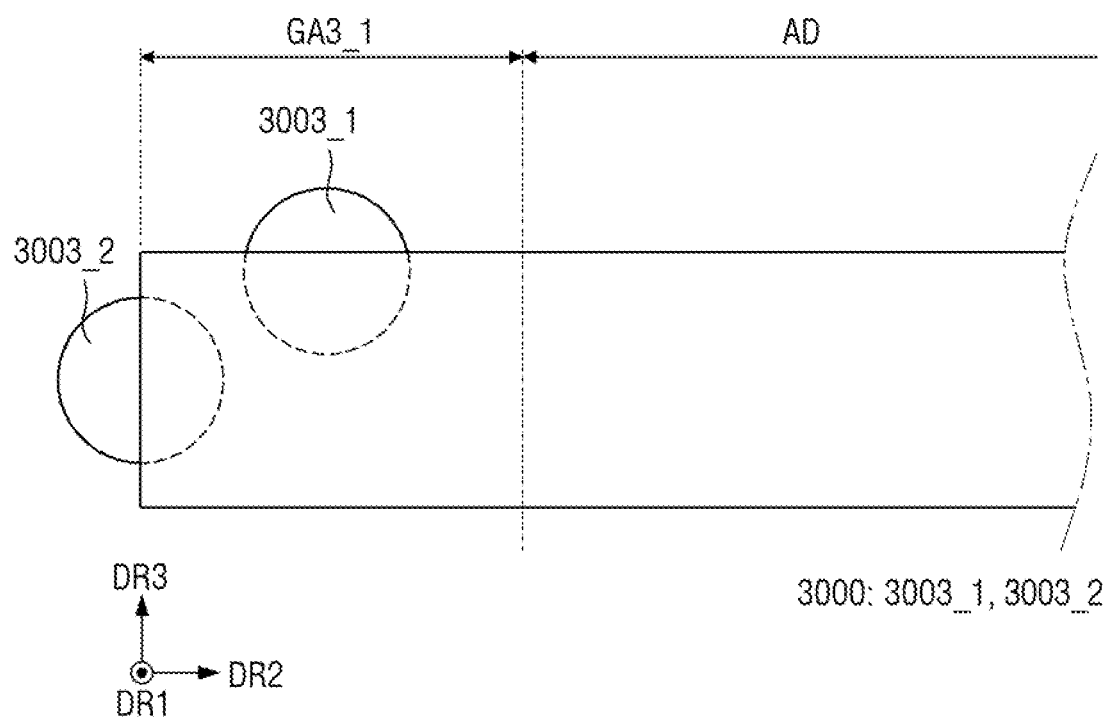

[Fig. 16]
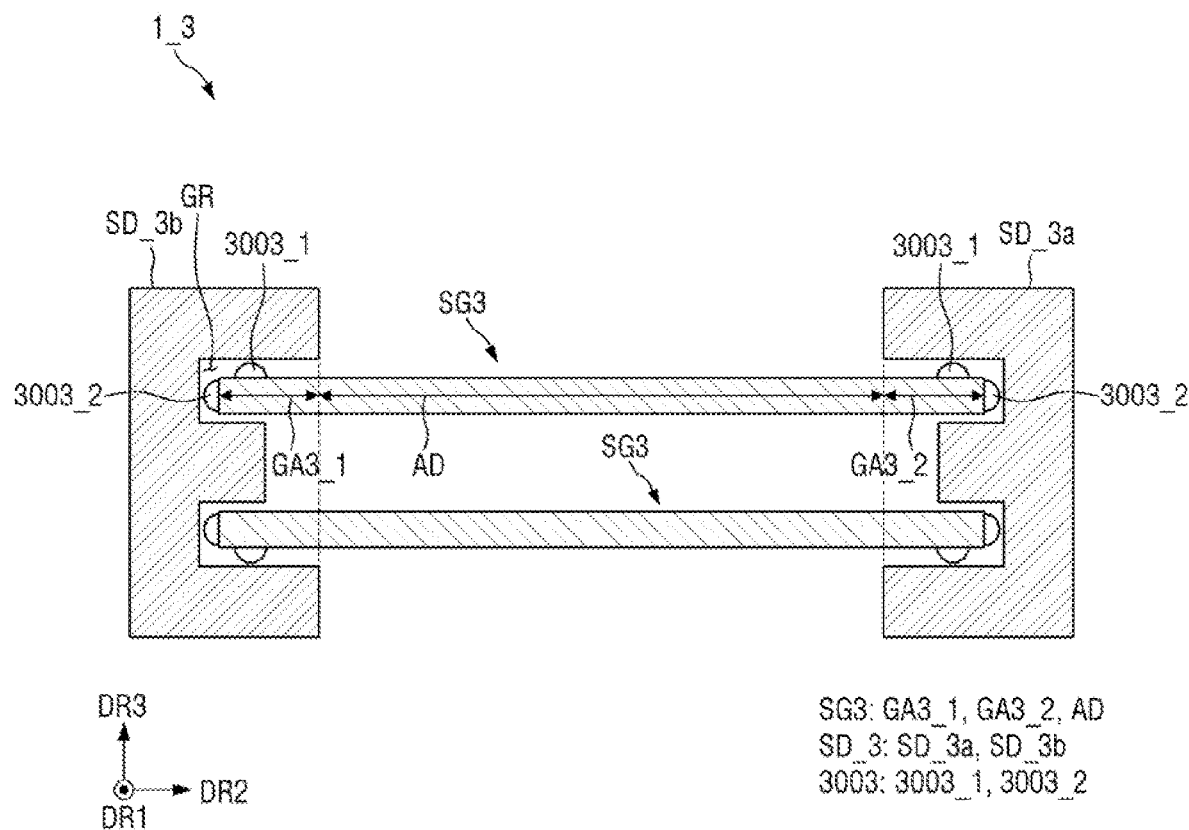

[Fig. 17]
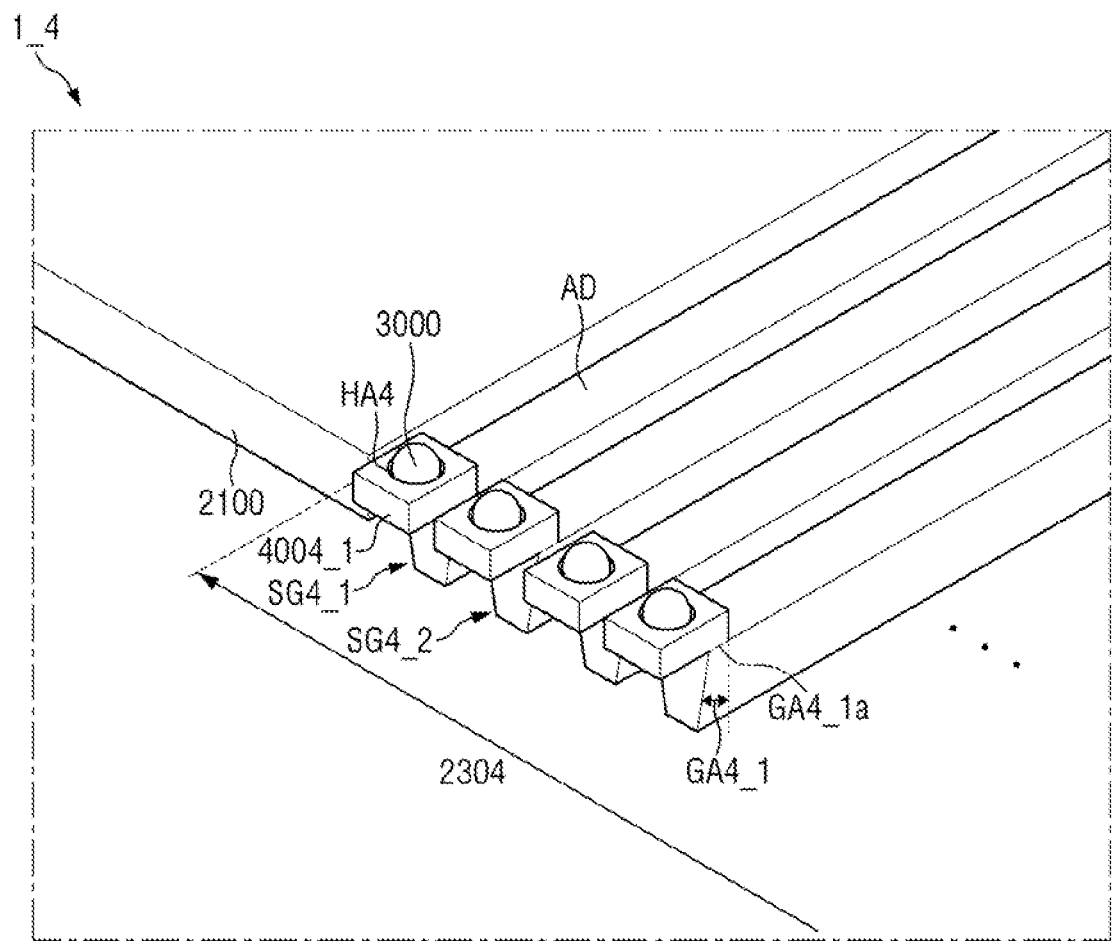
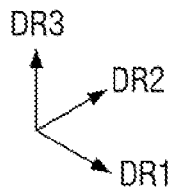

[Fig. 18]
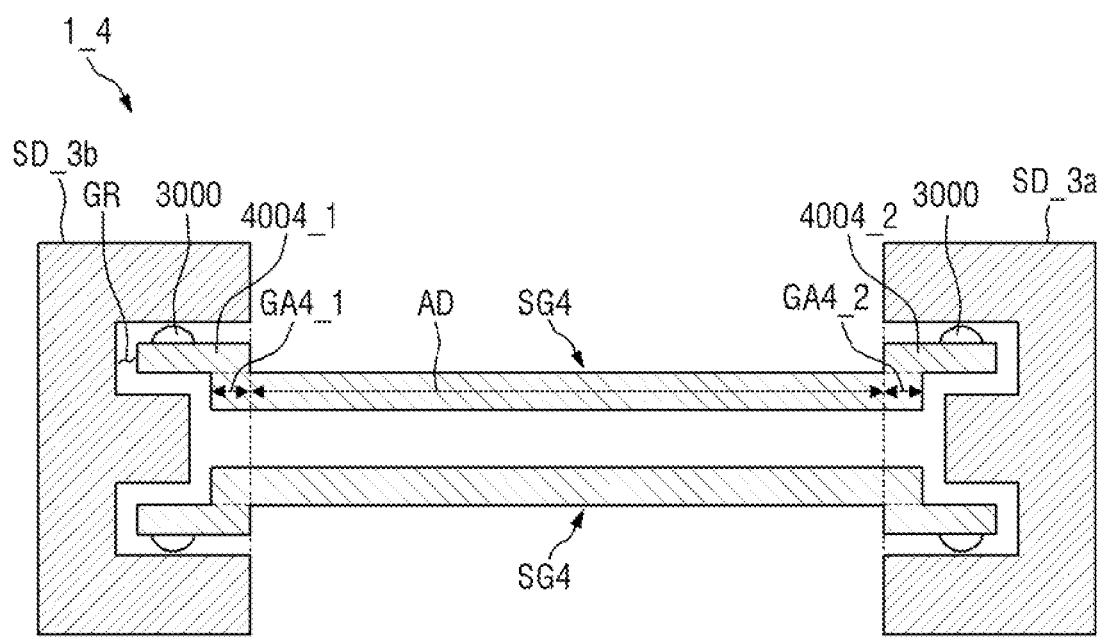

[Fig. 19]
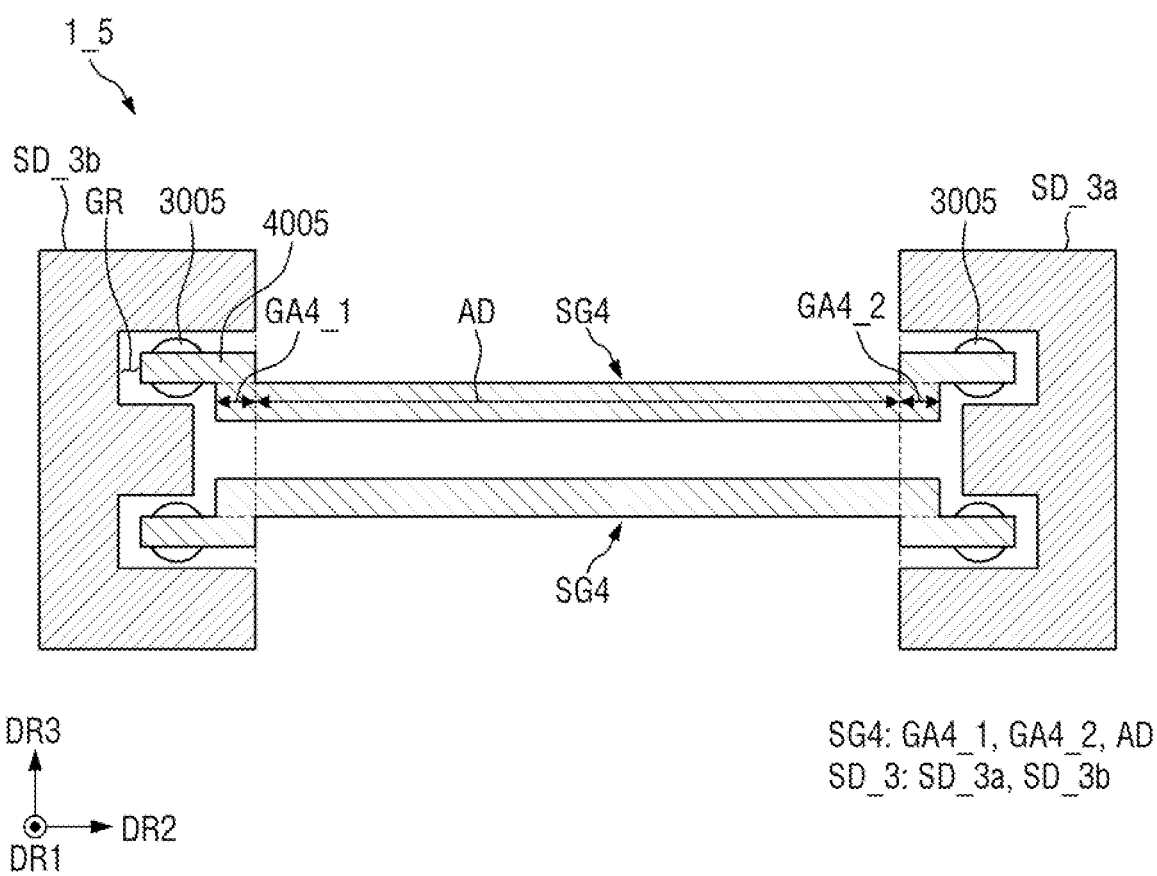

[Fig. 20]
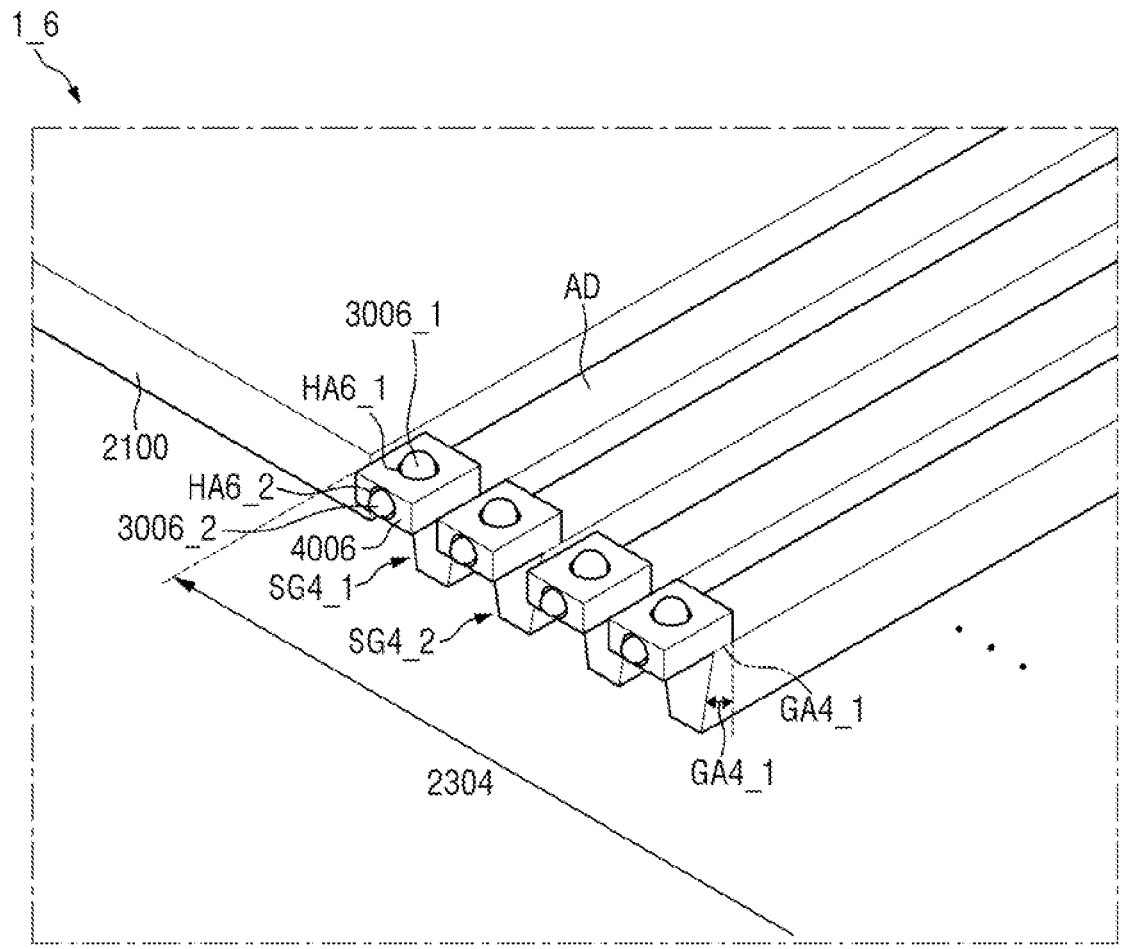
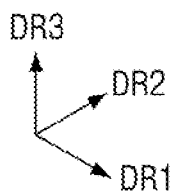
SG4: SG4_1, SG4_2
SG4_1: GA4_1, AD
SG4_2: GA4_1, AD
4004:HA4
HA6: HA6_1, HA6_2

[Fig. 21]
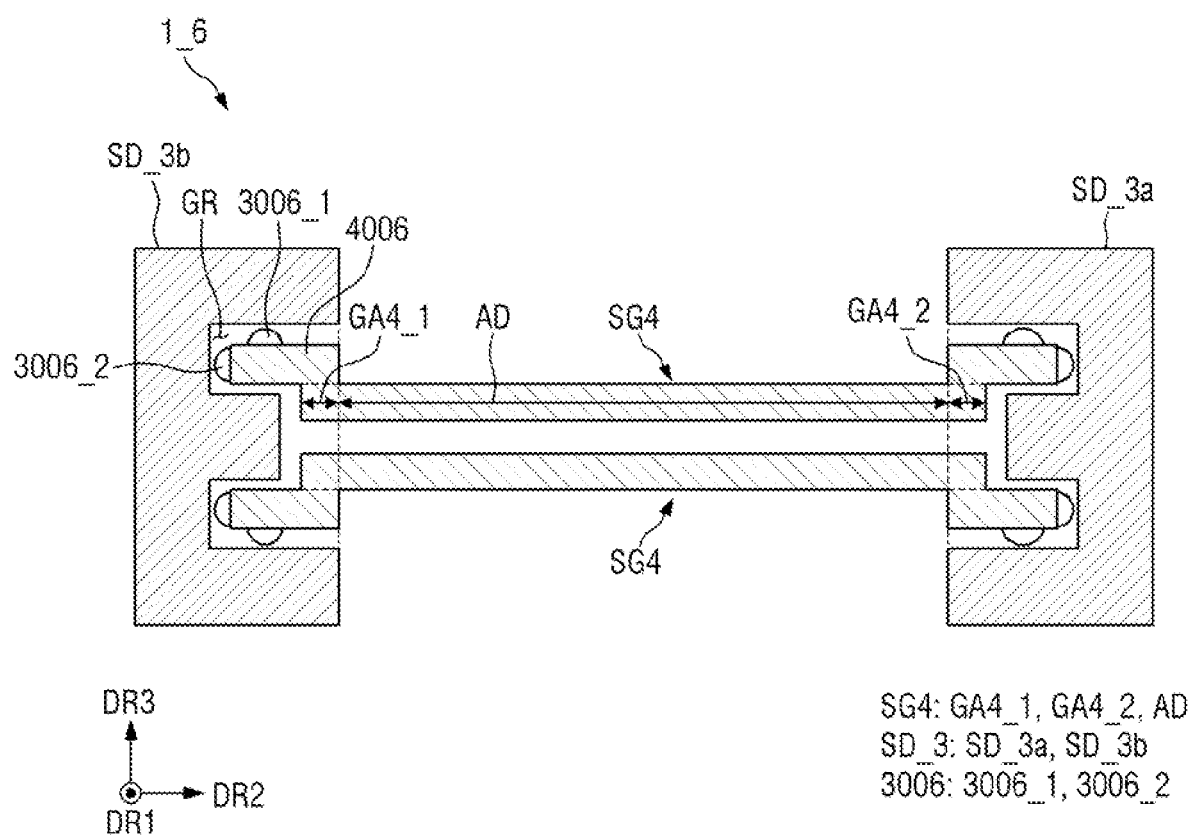

[Fig. 22]
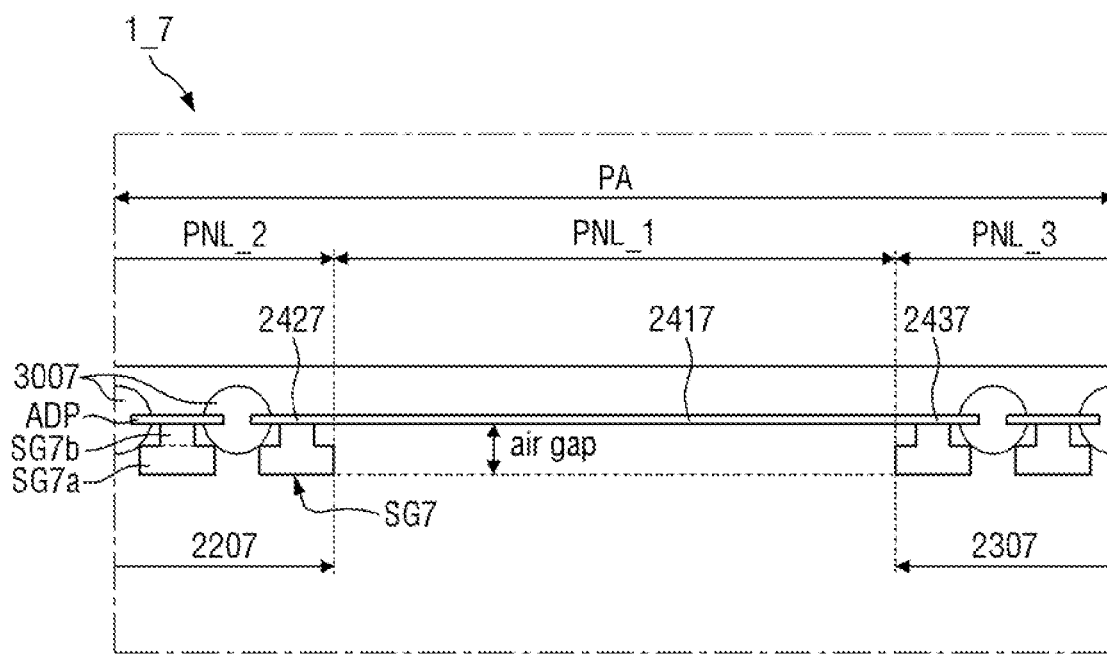

[Fig. 23]
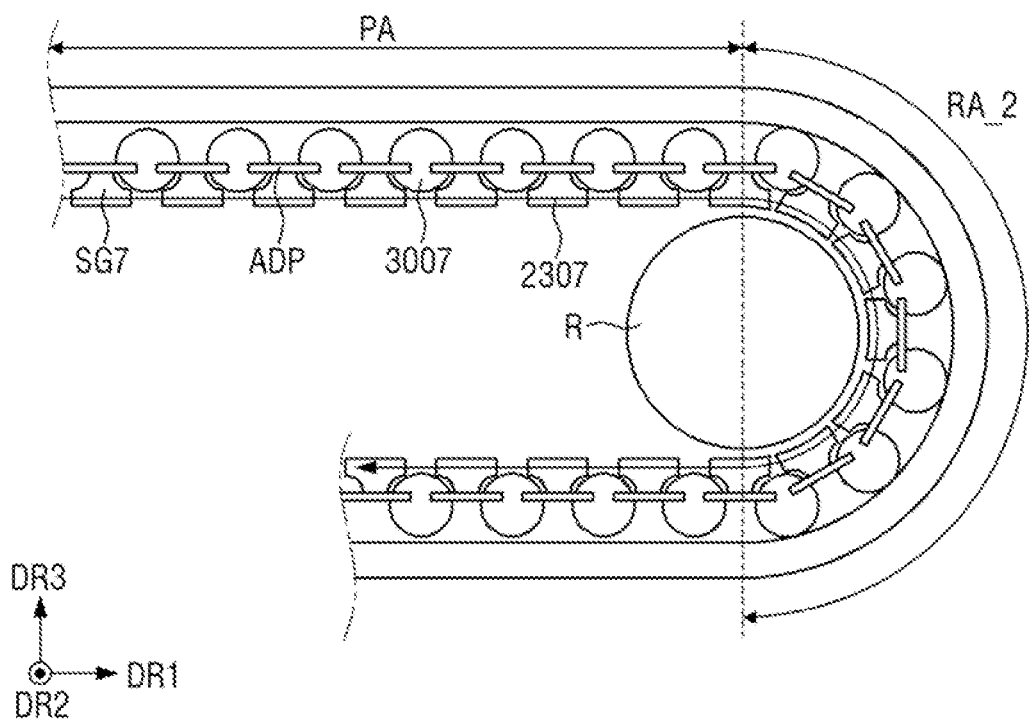

[Fig. 24]
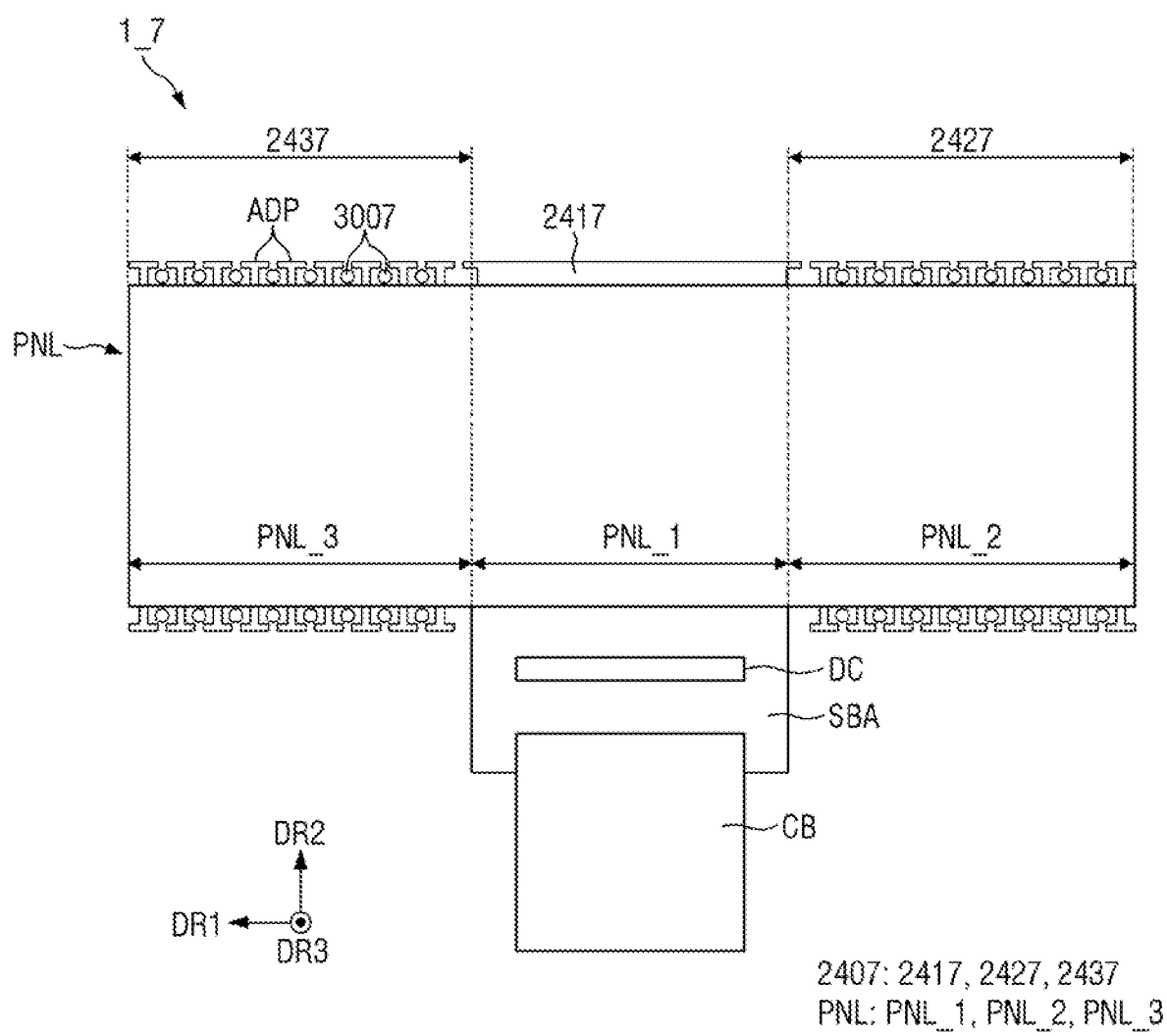

[Fig. 25]
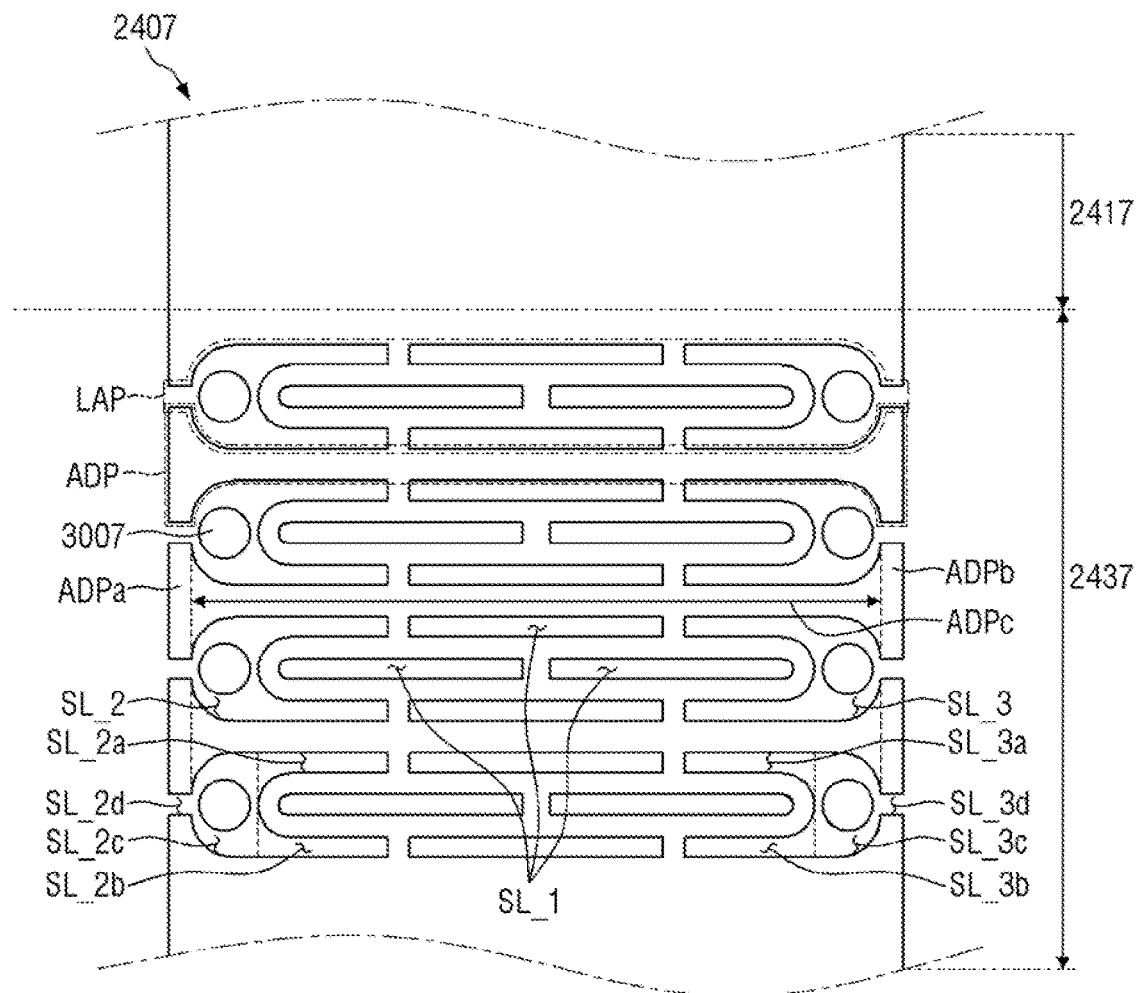
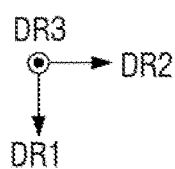

[Fig. 26]
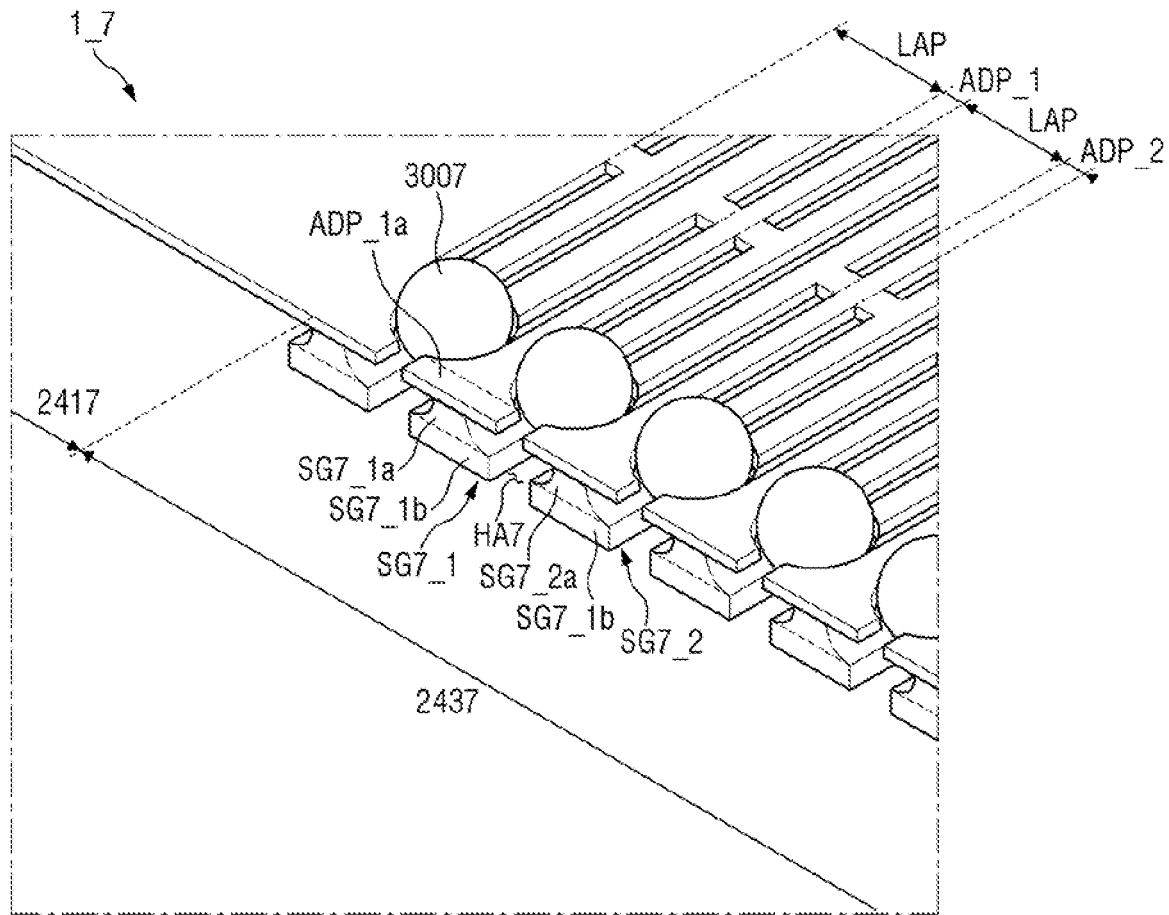

[Fig. 27]
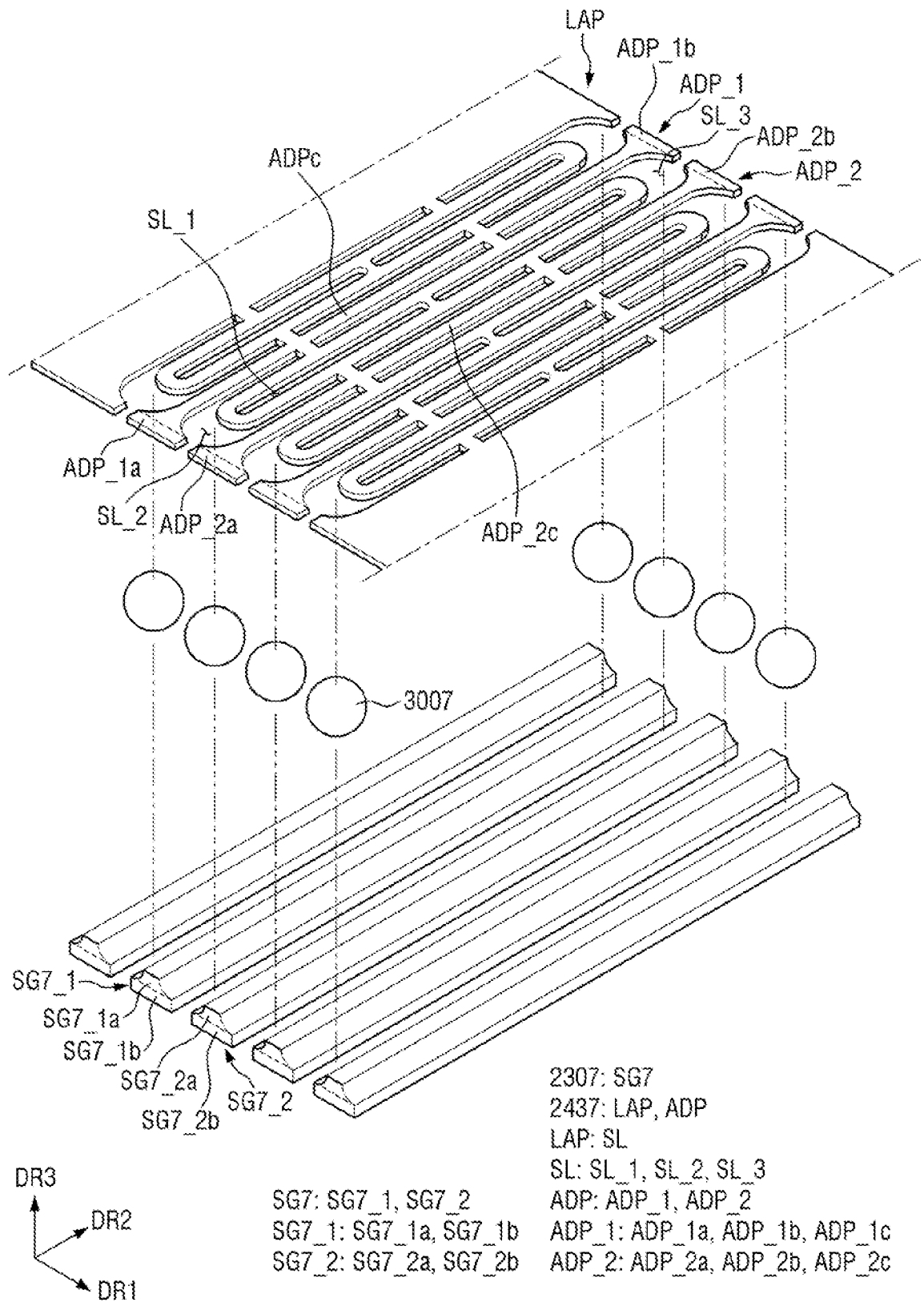

US 12,069,822 B2

PANEL SUPPORT AND DISPLAY DEVICE INCLUDING THE SAME

CROSS-REFERENCE TO RELATED APPLICATIONS

This application claims priority under 35 U.S.C. § 119 to Korean Patent Application No. 10-2021-0173958 filed on Dec. 7, 2021 in the Korean Intellectual Property Office, the disclosure of which is herein incorporated by reference in its entirety.

TECHNICAL FIELD

The present disclosure relates to a display device and, more specifically, to a panel support and a display device including the same.

DISCUSSION OF THE RELATED ART

Display devices are a widely used component in modern electronic devices owing to the growing importance of multimedia. Accordingly, a variety of types of display devices, such as organic light-emitting diode (OLED) display devices and liquid-crystal display (LCD) devices, are currently used.

Recently, as display technology evolves, research and development has been directed to providing a flexible display panel that is capable of being repeatedly bent to a meaningful extent without damage. The flexible display panel can be incorporated into a device that allows the panel to be extended or reduced by folding, rolling, bending, or sliding the display screen, thereby contributing greatly to the reduction of the volume or the design change of the display device.

SUMMARY

A display device includes a display panel configured to slide in a first direction. A panel storage compartment is configured to accommodate the display panel therein and to assist a sliding operation of the display panel in the first direction. A plurality of segments are attached to a lower surface of the display panel. These segments extend in a second direction intersecting the first direction, and are spaced apart from one another in the first direction. Bearings are disposed inside the plurality of segments and are at least partially exposed by the plurality of segments. The panel storage compartment includes guide rails engaged with the bearings.

Each of the plurality of segments may have housings where the bearings are accommodated. The bearings may be exposed from upper surfaces of the plurality of segments.

The bearings may penetrate through the plurality of segments and may be exposed by the upper surfaces of the segments and lower surfaces of the segments opposed to the upper surfaces.

The bearings may have a spherical shape, and a diameter of the bearings may be smaller than a width of housings.

Each of the plurality of segments may include protrusions on both sides of the display panel in the second direction and having the housings where the bearings are accommodated, and wherein the guide rails of the panel storage compartment engage with the protrusions and the bearings.

The bearings may include a first bearing and a second bearing. The housings may include a first housing accommodating the first bearing and a second housing accommodating the second bearing. The first bearing may be exposed by the upper surface of each of the plurality of segments and the second bearing may be exposed by a front surface of each of the plurality of segments at the protrusions. The upper surface and the front surface of each of the plurality of segments may face the panel storage compartment on the guide rails.

The first bearing and the second bearing might not overlap each other.

Each of the plurality of segments may include a depressed portion having a minimum thickness and a flat portion having a maximum thickness at the protrusions, and each of the housings may overlap the depressed portion but not the flat portion.

The depressed portion and the flat portion may each have a step in a third direction perpendicular to the first direction and the second direction. A height of the step may be substantially equal to a width by which the bearings are exposed in the third direction.

A display device includes a display panel configured to slide in a first direction. A panel storage compartment is configured to accommodate the display panel therein and to assist a sliding operation of the display panel in the first direction. A plurality of segments are attached to a lower surface of the display panel, are extended in a second direction intersecting the first direction, and are spaced apart from one another in the first direction. Guide members at least partially overlap upper surfaces of the segments and protrude on both sides of the display panel in the second direction. Bearings are disposed inside the guide members and are at least partially exposed from the guide members. The guide members incudes housings for accommodating the bearings. The panel storage compartment includes guide rails engaged with the guide members and the bearings.

The bearings may be exposed by upper surfaces of the guide members.

The bearings may penetrate through the guide members and may be exposed by the upper surface of the guide members and lower surfaces opposed to the upper surfaces.

The bearings may have a spherical shape.

A diameter of the bearings may be smaller than a width of the housings.

The bearings may include a first bearing and a second bearing. The housings may include a first housing accommodating the first bearing and a second housing accommodating the second bearing. The first bearing may be exposed from an upper surface of each of the guide members and the second bearing may be exposed from a front surface of each of the guide members. The upper surface and the front surface of each of the guide members may face the panel storage compartment on the guide rails.

The first bearing and the second bearing might not be in contact with each other.

A display device includes a display panel configured to slide in a first direction. A panel storage compartment is configured to accommodate the display panel therein. A support module is attached to a lower surface of the display panel, protruding on both sides of the display panel in a second direction, and assisting a sliding operation of the display panel in the first direction. Bearings are disposed inside the support module and are at least partially exposed by the support module. The support module includes a support plate. A plurality of segments are in contact with a lower surface of the support plate and are spaced apart from one another in the first direction. A width of an upper surface of each of the segments is smaller than a width of a lower surface. The plurality of segments includes a first segment and a second segment adjacent to the first segments. The first segment and the second segment are repeatedly arranged. The support plate includes a lattice pattern part composed of slits penetrating the support plate and disposed between the first segment and the second segment. Each of the bearings is disposed in a housing defined as a space between the first segment, the second segment and the lattice pattern part. The panel storage compartment includes guide rails engaged with the support module and the bearings.

Each of the first segments and the second segments may include a contact portion attached to the support plate and a body pattern portion disposed under the contact portion. A width of the contact portion may be smaller than a width of the body portion. A distance between the contact portions of the first segment and the second segment may be greater than a distance between the body portions of the first segment and the second segment.

The slits may include a first slit having a space in which the bearing is accommodated and formed at one end of the support plate in the second direction. The housing may at least partially overlap the first slit. Each of the bearings may be disposed in the first slit and may be exposed from an upper surface of the support plate.

The support plate may include a segment attachment area where the contact portion of the first segment and the contact portion of the second segment are attached. The segment attachment area may include a first anti-deviation portion that blocks one side of the first slit in the second direction.

A panel support may include a first support member extended in a first direction and a second direction intersecting the first direction. A second support member may be disposed adjacent to the first support member, extended in the second direction and may include a first segment and a second segment spaced apart from each other in the first direction. The first segment and the second segment may be arranged repeatedly. Bearings may be accommodated at both ends of each of the first segment and the second segment of the second support member in the second direction and may be at least partially exposed.

The second support member may be disposed on one side of the first support member in the first direction. Each of the first segment and the second segment may include a housing where the bearings are accommodated at both ends in the second direction.

The first support member may include a flat support area having a flat plate shape and a first pattern support area disposed on one side of the flat support area in the first direction. The first pattern support area may include lattice patterns formed at both ends of the first pattern support area in the second direction. Slits penetrating through the first support member may be arranged repeatedly in the lattice pattern. The first segment and the second segment of the second support member may be attached to a lower surface of the first pattern support area with the slits disposed therebetween. Each of the bearings may be accommodated in a housing formed with a space between the first segment and the second segment and the slits.

BRIEF DESCRIPTION OF THE DRAWINGS

The above and other aspects and features of the disclosure will become more apparent by describing in detail embodiments thereof with reference to the attached drawings, in which:

FIG. 1 is a perspective view of a display device according to an embodiment of the disclosure;

FIG. 2 is a perspective view showing the display device of FIG. 1 in an expanded state;

FIG. 3 is a plan view showing the structure of the display panel of the display device according to the embodiment of FIG. 1;

FIG. 4 is a plan view showing the structure of a support module under a display panel;

FIG. 5 is a plan view showing a stack structure of the display panel and the support module of FIG. 3 as viewed from the second direction;

FIG. 6 is a perspective view schematically showing the arrangement of the support module and bearings of FIG. 4;

FIG. 7 is a plan view of one of the segments of FIG. 6 viewed from the third direction;

FIG. 8 is an exploded perspective view schematically showing the structure of the panel storage compartment of FIG. 1;

FIG. 9 is a perspective view schematically showing a structure in which the support module and the panel storage compartment of the display device according to the embodiment of FIG. 1 are combined;

FIG. 10 is a cross-sectional view showing a cross section taken along line X1-X1' of FIG. 9;

FIG. 11 is a plan view schematically showing the structure of a support module, a panel storage compartment and bearings of a display device according to an embodiment;

FIG. 12 is a perspective view schematically showing an arrangement of a support module and bearings of a display device according to an embodiment;

FIG. 13 is a plan view of the segments and the bearings of FIG. 12 viewed from the third direction;

FIG. 14 is a perspective view schematically showing an arrangement of a support module and bearings of a display device according to an embodiment;

FIG. 15 is a plan view of the segments and the bearings of FIG. 14 viewed from the third direction;

FIG. 16 is a plan view schematically showing the structure of the support module, the panel storage compartment and the bearings of FIG. 14;

FIG. 17 is a perspective view schematically showing an arrangement of a support module and bearings of a display device according to an embodiment;

FIG. 18 is a plan view schematically showing the structure of the support module, the panel storage compartment and the bearings of FIG. 16;

FIG. 19 is a plan view schematically showing the structure of a support module, a panel storage compartment and bearings of a display device according to an embodiment;

FIG. 20 is a perspective view schematically showing an arrangement of a support module and bearings of a display device according to an embodiment;

FIG. 21 is a plan view schematically showing the structure of the support module, the panel storage compartment and the bearings of FIG. 20;

FIG. 22 is a plan view schematically showing the structure of a display panel, a support module and bearings of a display device according to an embodiment;

FIG. 23 is a plan view showing the behavior of a support module and bearings in a rounded area of a display device;

FIG. 24 is a plan view schematically showing the display panel of FIG. 22;

FIG. 25 is a plan view showing the support plate of FIG. 22 as viewed from the third direction;

FIG. 26 is a perspective view schematically showing the arrangement structure of the support module and the bearings of FIG. 22; and FIG. 27 is an exploded perspective view for illustrating the arrangement structure of the support plate, the segments and the bearings according to the embodiment of FIG. 22.

DETAILED DESCRIPTION OF THE EMBODIMENTS

The present invention will now be described more fully hereinafter with reference to the accompanying drawings, in which embodiments of the invention are shown. This invention may, however, be embodied in different forms and should not necessarily be construed as limited to the embodiments set forth herein. Rather, these embodiments are provided so that this disclosure will be thorough and complete, and will fully convey the scope of the invention to those skilled in the art.

It will also be understood that when a layer is referred to as being "on" another layer or substrate, it can be directly on the other layer or substrate, or intervening layers may also be present. The same reference numbers may indicate the same components throughout the specification and the drawings.

It will be understood that, although the terms "first," "second," etc. may be used herein to describe various elements, these elements should not necessarily be limited by these terms. These terms might be used to distinguish one element from another element. For instance, a first element discussed below could be termed a second element without departing from the teachings of the present invention. Similarly, the second element could also be termed the first element.

Features of each of various embodiments of the present disclosure may be partially or entirely combined with each other and may technically variously interwork with each other, and respective embodiments may be implemented independently of each other or may be implemented together in association with each other.

Hereinafter, embodiments of the disclosure will be described with reference to the accompanying drawings.

FIG. 1 is a perspective view of a display device according to an embodiment of the disclosure. FIG. 2 is a perspective view showing the display device of FIG. 1 in an expanded state. FIG. 3 is a plan view showing the structure of the display panel of the display device according to the embodiment of FIG. 1. FIG. 4 is a plan view showing the structure of a support module under a display panel. FIG. 5 is a plan view showing a stack structure of the display panel and the support module of FIG. 3 as viewed from the second direction. FIG. 6 is a perspective view schematically showing the arrangement of the support module and bearings of FIG. 4. FIG. 7 is a plan view of one of the segments of FIG. 6 viewed from the third direction.

Referring to FIGS. 1 and 2, a display device 1, according to an embodiment, may be a sliding display device or a slidable display device. The display device 1 may be, but is not necessarily limited to being, a multi-slidable display device that slides in two directions. For example, the display device 1 may be a single slideable display device that slides only in one direction. The following description will focus on a multi-slidable display device.

The display device 1 has a three-dimensional shape. For example, the display device 1 may have a cuboid shape or a three-dimensional shape similar to it. In the drawing, a direction parallel to a first side (horizontal side) of the display device 1 is referred to as a first direction DR1, and a direction parallel to a second side (vertical side) of the display device 1 is referred to as a second direction DR2, and the thickness direction of the display device 1 is referred to as a third direction DR3. As used herein, a direction may refer to the direction indicated by the arrow as well as the opposite direction, unless specifically stated otherwise.

If it is necessary to discern between such two opposite directions, one of the two directions may be referred to as "one side in the direction," while the other direction may be referred to as "the opposite side in the direction."

In FIG. 1, the side indicated by the arrow of a direction is referred to as one side in the direction, while the opposite side is referred to as the opposite side in the direction. The first direction DR1 and the second direction DR2 are perpendicular to each other, the first direction DR1 and the third direction DR3 are perpendicular to each other, and the second direction DR2 and the third direction DR3 may be perpendicular to each other.

The display device 1 may include a planar area PA and rounded areas RA. The planar area PA of the display device 1 at least partially overlaps with an open area of a panel storage compartment SD where a display panel PNL is exposed, which will be described later. The rounded areas RA of the display device 1 may be located inside the panel storage compartment SD. The rounded areas RA may be curved with a predetermined radius of curvature, and the display panel PNL may be curved according to the radius of curvature. The round areas RA may be disposed on opposite sides of the planar area PA in the first direction DR1, respectively. For example, a first round area RA_1 may be disposed on the opposite side of the planar area PA in the first direction DR1 while a second round area RA_2 may be disposed on one side of the planar area PA in the first direction DR1. In the first rounded area RA_1, a second area PNL_2 of the display panel PNL, which will be described later, may be curved. In the second rounded area RA_2, a third area PNL_3 of the display panel PNL, which will be described later, may be curved. As shown in FIG. 2, the planar area PA may increase as the display device 1 expands. Accordingly, the distance between the first rounded area RA_1 and the second rounded area RA_2 may increase.

Referring to FIGS. 1 to 7, the display device 1, according to the embodiment, may include a display panel PNL, a support module 2000, bearings 3000, and a panel storage compartment SD.

The display panel PNL displays images thereon. Any kind of display panel may be employed as the display panel PNL, according to the embodiment, such as an organic light-emitting diode (OLED) display panel including an organic light-emitting layer, a micro light-emitting diode display panel using micro LEDs, a quantum-dot light-emitting display panel using quantum-dot light-emitting diodes including quantum-dot light-emitting layer, and an inorganic light-emitting display panel using inorganic light-emitting elements including an inorganic semiconductor.

The display panel PNL may be a flexible panel. The display panel PNL may have flexibility so that it can be at least partially rolled, bent or curved in the panel storage compartment SD of the sliding module, as will be described later. The display panel PNL may slide in the first direction DR1.

The display panel PNL may include a first area PNL_1 supported by a first support member 2100 of the support module 2000, a second area PNL_2 supported by a second support member 2200 thereof, and a third area PNL_3 supported by a third support member 2300 thereof, which will be described later. The first area PNL_1 of the display panel PNL may be flat in all states of the display device and this first area PNL_1 may maintain a flat shape regardless of the sliding operation. Each of the second area PNL_2 and the third area PNL_3 of the display panel PNL may be either a bent area that is rolled, bent or curved, or a bendable area changing between a rolled, bent or curved shape and a flat shape according to the sliding operation.

Referring to FIG. 3, one surface of the display panel PNL in the third direction DR3 may be the upper surface where images are displayed, and the other surface of the display panel PNL in the third direction DR3 may be the lower surface on which the support module 2000 is disposed.

The display area DA of the display panel PNL may be divided into the first display area DA_1, the second display area DA_2 and the third display area DA_3, depending on whether the display panel PNL slides or not and on how long it slides if it does (e.g., how far it is slid). The presence of the second display area DA_2 and the third display area DA_3 may depend on whether the display panel PNL slides or not, and the areas of them may vary depending on how long it slides. For example, when the display panel PNL does not slide (hereinafter referred to as a "first state"), it has the first display area DA_1 having a first area. When the display panel PNL slides (hereinafter referred to as a "second state"), it further includes the expanded second display area DA_2 and third display area DA_3 in addition to the first display area DA_1.

In the second display area DA_2, the second area PNL_2 of the display panel PNL and the planar area PA may overlap each other. In the third display area DA_3, the third area PNL_3 of the display panel PNL and the planar area PA may overlap each other.

The areas of the second display area DA_2 and the third display area DA_3 may vary depending on how long the display device 1 slides (e.g., how far it has slid). When the display device 1 slides to the maximum, the second display area DA_2 has a second area, the third display area DA_3 has a third area, and the display area DA has a fourth area which is the sum of the first area, the second area and the third area. The fourth area may be the maximum area that the display area DA can have.

The first display area DA_1 may overlap with the first area PNL_1 of the display panel PNL. The second display area DA_2 may overlap with at least a part of the second area PNL_2 of the display panel PNL. The third display area DA_3 may overlap with at least a part of the third area PNL_3 of the display panel PNL. In some embodiments, the boundary between the first display area DA_1 and the second display area DA_2 may coincide with the boundary between the first area PNL_1 and the second area PNL_2, and the boundary between the first display area DA_1 and the second display area DA_2 may coincide with the boundary between the first area PNL_1 and the third area PNL_3. It should be understood, however, that the disclosure is not necessarily limited thereto.

The display panel PNL may further include a subsidiary area SBA. The subsidiary area SBA may be disposed on one side of the first area PNL_1 of the display panel PNL in the second direction DR2. The subsidiary area SBA may be folded, curved or bent. When the subsidiary area SBA is bent, the subsidiary area SBA may overlap the first area PNL_1 in the third direction DR3. The subsidiary area SBA may have, but is not necessarily limited to having, a rectangular shape when viewed from the top.

The length of the subsidiary area SBA in the first direction DR1 may be substantially equal to the length of the first area PNL_1 in the first direction DR1. Alternatively, the length of the subsidiary area SBA in the first direction DR1 may be smaller than the length of the first area PNL_1 in the first direction DR1. In some embodiments, the length of the subsidiary area SBA in the second direction DR2 may be smaller than the length of the first area PNL_1 in the second direction DR2. It should be understood, however, that the disclosure is not necessarily limited thereto.

A driver circuit DC and a circuit board CB may be disposed on one surface of the subsidiary area SBA in the third direction DR3. The circuit board CB may be attached on the subsidiary area SBA using an anisotropic conductive film (ACF). The circuit board CB may be electrically connected to a pad area formed on the subsidiary area SBA. The circuit board CB may be a flexible printed circuit board (FPCB), a printed circuit board (PCB), or a flexible film such as a chip-on-film (COF). The driver circuit DC may be implemented as an integrated circuit (IC) and may be attached to the subsidiary area SBA by a chip-on-glass (COG) technique, a chip-on-plastic (COP) technique, or ultrasonic bonding. Alternatively, the driver circuit DC may be mounted on the circuit board CB.

The display panel PNL may further include an elastic member EM. The elastic member EM can prevent the first support member 2100, the second support member 2200 and the third support member 2300 of the support module 2000, which will be described later, from being viewed through the display panel PNL, and can absorb stress that may occur according to the behavior of the first support member 2100, the second support member 2200 and the third support member 2300, thereby preventing the stress from affecting the display panel PNL. The elastic member EM may be disposed between the display panel PNL and the support module 2000. The elastic member EM may include a polymer material having an elastic modulus. The elastic member EM may be omitted in some implementations.

The support module 2000 may be attached to the lower surface of the display panel PNL to support the display panel PNL and may assist in sliding operations of the display panel PNL in the first direction DR1. The support module 2000 may be referred to as a panel support. Referring to FIG. 4, the support module 2000 may include a first support member 2100, a second support member 2200 and a third support member 2300 disposed on the lower surface of the display panel PNL. The support module 2000 may include a metal to ensure mechanical strength for supporting the display panel PNL. In some embodiments, the support module 2000 may include, but is not necessarily limited to including, a metal such as a stainless steel alloy, for example, SUS304.

In Area A shown in FIG. 4, the display panel PNL may be disposed. The first support member 2100, the second support member 2200 and the third support member 2300 of the support module 2000 may protrude on opposite sides of the display panel PNL in the second direction DR2, when viewed from the third direction DR3, such that they do not overlap with Area A. For example, the width of the display panel PNL in the second direction DR2 may be smaller than the width of the first support member 2100 of the support module 2000 in the second direction DR2, the width of the second support member 2200 of the support module 2000 in the second direction DR2, and the width of the third support member 2300 of the support module 2000 in the second direction DR2.

The first support member 2100 may support the first area PNL_1 of the display panel PNL. The first support member 2100 may be disposed on the lower surface of the first area PNL_1 of the display panel PNL. The first support member 2100 may be a flat plate, and its shape may be substantially identical to the shape of the first area PNL_1 when viewed from the top. For example, the shape of the first support member 2100 may be, but is not necessarily limited to being, a rectangle extended in the first direction DR1 and the second direction DR2 or a plane similar to a rectangle when viewed from the top. As shown in FIG. 5, an air gap may be formed on the opposite side of the first support member 2100 in the third direction DR3. By forming the air gap under the first support member 2100, it is possible to mitigate a physical shock that may be applied to the display panel PNL. For example, the air gap may absorb a physical shock when an object such as a user's pen drops onto the first area PNL_1 of the display panel PNL.

The second support member 2200 may support the second area PNL_2 of the display panel PNL. The second support member 2200 may be disposed on the lower surface of the second area PNL_2 of the display panel PNL. The second support member 2200 may include a plurality of segments SG extended in the second direction DR2 and spaced apart from one another in the first direction DR1. For example, the second support member 2200 may be a collection of a plurality of segments SG arranged on the lower surface of the second area PNL_2 of the display panel PNL.

The third support member 2300 may support the third area PNL_3 of the display panel PNL. The third support member 2300 may be disposed on the lower surface of the third area PNL_3 of the display panel PNL. The third support member 2300 may include a plurality of segments SG extended in the second direction DR2 and spaced apart from one another in the first direction DR1. For example, the third support member 2300 may be a collection of a plurality of segments SG arranged on the lower surface of the second area PNL_2 of the display panel PNL.

Referring to FIG. 5, one surface of each of the plurality of segments SG in the third direction DR3 may be the upper surface attached to the display panel PNL, and the opposite surface of each of the plurality of segments SG may be the lower surface opposed to the upper surface. In addition, the opposite surface of each of the plurality of segments SG in the second direction DR2 may be the front surface facing the panel storage compartment SD on the guide rails GR, and one surface thereof in the second direction DR2 may be the rear surface facing the panel storage compartment SD on the guide rails GR, which will be described later. The upper surface, the lower surface and the rear surface may be adjacent to one another. The definitions of the upper surface, the lower surface, the front surface and the rear surface may be equally applied to the description on an area of segments SG. The shape of the plurality of segments SG viewed from the second direction DR2, i.e., the shape of the front surface, may have a shape having the width in the first direction DR1 decreasing toward the opposite side in the third direction DR3 as shown in FIG. 5. It should be understood, however, that the disclosure is not necessarily limited thereto.

Each of the plurality of segments SG may include protrusions GA_1 and GA_2 protruding from the display panel PNL in the second direction DR2 as shown in FIGS. 4, 6 and 7. For example, the protrusions GA_1 and GA_2 include a first protrusion GA_1 that protrudes on the opposite side of the display panel PNL in the second direction DR2, and a second protrusion GA_2 that protrudes on one side of the display panel PNL in the second direction DR2. An adhesive area AD where the display panel PNL is attached may be located between the first protrusion GA_1 and the second protrusion GA_2.

The adhesive area AD of each of the plurality of segments SG may be attached to the lower surface of the display panel PNL. An additional adhesive layer may be interposed between the adhesive area AD of each of the plurality of segments SG and the lower surface of the display panel PNL. In some embodiments, the width of the display panel PNL in the second direction DR2 may be substantially equal to the width of the adhesive area AD of each of the plurality of segments SG in the second direction DR2. It should be understood, however, that the disclosure is not necessarily limited thereto.

The protrusions GA_1 and GA_2 of each of the plurality of segments SG protrude from the opposite sides of the display panel PNL in the second direction DR2 and are engaged with guide rails GR of the panel storage compartment SD (see FIGS. 8 and 9) to assist the slide operation of the display panel PNL in the first direction DR1, as will be described later. A structure in which the guide rails GR of the panel storage compartment SD are engaged with the protrusions GA_1 and GA_2 of the plurality of segments SG will be described later.

Each of the plurality of segments SG may have housings HA on opposite sides extended in the second direction DR2, where bearings 3000 to be described later are disposed. For example, the housings HA may be formed in the first protrusion GA_1 and the second protrusion GA_2 of each of the plurality of segments SG. The housings HA may store and operate the bearings 3000.

The support module 2000 may include the bearings 3000. The bearings 3000 may reduce friction between the plurality of segments SG and the guide rails GR of the panel storage compartment SD to be described later. In some embodiments, the bearings 3000 may have, but are not necessarily limited to having, a spherical shape. The bearings 3000 may be disposed inside the protrusions GA_1 and GA_2 of each of the plurality of segments SG such that they are at least partially exposed. For example, the bearings 3000 are stored in the housings HA formed in the protrusions GA_1 and GA_2 of each of the plurality of segments SG, and a part of the bearings 3000 is exposed from the upper surface of the plurality of segments SG such that they are in contact with the guide rails GR of the display panel PNL, as will be described later. Each of bearings 3000 may include a metal. In some embodiments, the bearings 3000 may include, but is not necessarily limited to including, a metal such as a stainless steel, for example, SUS304.

As described above, the plurality of segments SG may include a first segment SG_1 having housings HA formed in the upper surface where the bearings 3000 can be disposed, and a second segment SG_2 adjacent to the first segment SG_1 and having housings HA in the upper surface where the bearings 300 can be formed. The first segment SG_1 and the second segment SG_2 may be arranged alternately and/or repeatedly.

Referring to FIG. 7, the width d_HA of the housing HA formed in each of the protrusions GA_1 and GA_2 may be greater than the diameter d_3000 of the bearing 3000. Accordingly, the bearing 3000 may be stably accommodated and operated in the housing HA.

Hereinafter, the behavior of the panel storage compartment SD and the plurality of segments SG will be described in detail.

FIG. 8 is an exploded perspective view schematically showing the structure of the panel storage compartment of FIG. 1. FIG. 9 is a perspective view schematically showing a structure in which the support module and the panel storage compartment of the display device according to the embodiment of FIG. 1 are combined. FIG. 10 is a cross-sectional view showing a cross section taken along line X1-X1' of FIG. 9.

As shown in FIGS. 1 and 2, the panel storage compartment SD accommodates at least a part of the display panel PNL and the support module 2000, and may assist the sliding operation of the display device 1. The panel storage compartment SIDE may include a first storage compartment SD_1 located at the center of the display device 1, a second storage compartment SD_2 disposed on the opposite side of the first storage compartment SD_1 in the first direction DR1 and comprising the first rounded area RA_1, and a third storage compartment SD_3 disposed on one side of the first storage compartment SD_1 in the first direction DR1 and comprising the second rounded area RA_2. The first storage compartment SD_1 may connect the second storage compartment SD_2 with the third storage compartment SD_3. Rails are formed inside the second storage compartment SD_2 and the third storage compartment SD_3 to guide the sliding operations of the display panel PNL.

For example, referring to FIG. 8, the first storage compartment SD_1 may include a first sidewall SD_1a on one side in the second direction DR2 and a second sidewall SD_1b on the opposite side in the second direction DR2. An area where a part of the display panel PNL is exposed may be formed between the first sidewall SD_1a and the second sidewall SD_1b. At the opposite ends of each of the first sidewall SD_1a and the second sidewall SD_1b in the third direction DR3, fixing portions protruding in the second direction DR2, i.e., toward the inside of the first storage compartment SD_1, may be formed. For example, a first fixing portion P1 may be formed at one end of each of the first sidewall SD_1a and the second sidewall SD_1b in the third direction DR3, and a second fixing portion P2 may be formed at the opposite end of each of the first sidewall SD_1a and the second sidewall SD_1b in the third direction DR3. The first fixing portion P1 and the second fixing portion P2 may face each other in the third direction DR3. Accordingly, the third storage compartment SD_3 may be engaged and slid in the space formed between the first fixing portion P1 and the second fixing portion P2. The sliding movement of the second storage compartment SD_2 may be identical to that of the third storage compartment SD_3. Thus, the third storage compartment SD_3 will be mainly described, and the second storage compartment SD_2 will be understood to be at least similar to the third storage compartment SD_3.

The third storage compartment SD_3 may include slide portions on opposite sides extended in the second direction DR2. For example, the third storage compartment SD_3 may include a first slide portion SD_3a on one side in the second direction DR2, and a second slide portion SD_3b on the opposite side in the second direction DR2. The slide portions may have a flat plate shape having a plane defined in the first direction DR1 and the third direction DR3. The slide portions may be engaged with the first fixing portion P1 and the second fixing portion P2 formed on each of the first sidewall SD_1a and the second sidewall SD_1b of the first storage compartment SD_1 to slide in the first direction DR1.

Guide rails GR may be formed on the first slide portion SD_3a and the second slide portion SD_3b of the third storage compartment SD_3 so that the segments SG of the support module 2000 engage with them. The guide rails GR may define trajectories along which the display panel PNL slides. The guide rails GR may be grooves dug in the first slide portion SD_3a and the second slide portion SD_3b and may be configured to engage with the protrusions GA_1 and GA_2 of each of the plurality of segments SG. The guide rails GR may have a shape in which the U-shape is rotated by 90° counterclockwise. For example, the guide rail GR may have a shape that is extended toward one side in the first direction DR1, is bent in the third direction DR3 where the second rounded area RA_2 is curved, and then is extended toward the opposite side in the first direction DR1. Holes H may be formed a part of the slide portions where the guide rails GR are bent for disposing a roll R, which will be described later.

The panel storage compartment SD may further include a roll R. The roll R may assist the sliding behavior of the display panel PNL. The roll R may be in a cylindrical shape having a circular cross-section. The roll R may be inserted and fixed in the holes H formed in the slide portions.

Referring to FIG. 9, the protrusions GA_1 and GA_2 of each of the plurality of segments SG of the third support member 2300 attached to the lower surface of the third area PNL_3 of the display panel PNL engaged with the guide rails GR of the third storage compartment SD_3. When the third storage compartment SD_3 slides from the first storage compartment SD_1 in the first direction DR1, the third support member 2300 also slides along the guide rails GR in the first direction DR1. Accordingly, the display panel PNL may also slide in the first direction DR1.

Referring to FIGS. 10, the bearings 3000 exposed from the upper surface of the segments SG are engaged with the guide rails GR of the panel storage compartment SD to prevent direct contact between the guide rails GR and the segments SG, so that it is possible to increase the reliability of the display device 1 by reducing friction therebetween.

The upper surface of the segments SG may face the panel storage compartment SD in the guide rails GR. The guide rails GR of the third storage compartment SD_3 may be grooves formed in the second direction DR2, i.e., in the direction toward the outside of the third storage compartment SD_3. The protrusions GA_1 and GA_2 of the plurality of segments SG is engaged with the guide rails GR, and direct contact with the third storage compartment SD_3 can be prevented by the bearings 3000 disposed at the protrusions GA_1 and GA_2.

Hereinafter, embodiments of the disclosure will be described. In the following description, to the extent that an element has not been described in detail herein, it may be assumed that the element is at least similar to a corresponding element that has been described elsewhere within the present disclosure.

FIG. 11 is a plan view schematically showing the structure of a support module, a panel storage compartment and bearings of a display device according to an embodiment.

FIG. 11 shows an example where bearings 3001 of a display device 1_1 according to this embodiment may penetrate segments SG in the third direction DR3. Since the bearings 3001 of the display device 1_1 according to this embodiment penetrates the segment SG1 in the third direction DR3, the panel storage compartment SD and the plurality of segments SG1 cannot be in direct contact with each other. For example, when the segments SG1 are engaged with the guide rails GR formed in the second storage compartment SD_2 and the third storage compartment SD_3, the bearings 3001 are partially exposed on the upper and lower surfaces of each of the segments SG1. the bearings 3001 exposed on the upper and lower surfaces of each of the segments SG1 are engaged with the guide rails GR, so that it is possible to prevent direct contact between the second storage compartment SD_2 and the upper and lower surfaces of the segments SG1 and between and the third storage compartment SD_3 and the upper and lower surfaces of the segments SG1. The upper surface and the lower surface of the segments SG1 may face the panel storage compartment SD in the guide rails GR.

In some embodiments, the width SG1_h (hereinafter referred to as thickness) of the plurality of segments SG1 in the third direction DR3 may be smaller than the width (hereinafter referred to as thickness) of the plurality of segments SG1 in the third direction DR3 in the display device 1 according to the embodiment of FIG. 1. It should be understood, however, that the disclosure is not necessarily limited thereto.

FIG. 12 is a perspective view schematically showing an arrangement of a support module and bearings of a display device according to an embodiment. FIG. 13 is a plan view of the segments and the bearings of FIG. 12 viewed from the third direction.

Referring to FIGS. 12 and 13, each of protrusions GA2_1 and GA2_2 of the plurality of segments SG2 of the display device 1_2 according to this embodiment may have a step W2. For example, each of the protrusions GA2_1 and GA2_2 of the plurality of segments SG2 may include a depressed portion GA2_1a and a flat portion GA2_1b. The thickness of each of the plurality of segments SG2 may have the minimum value in the depressed portion GA2_1a of the protrusions GA2_1 and GA2_2. The configuration of the first protrusion GA2_1 and the second protrusion GA2_2, the relationship between the first protrusion and the bearings 3000, and the relationship between the second protrusion GA2_2 and the bearings 3000 are substantially the same. Therefore, the first protrusion GA2_1 will be mainly described, and the second protrusion GA2_2 may be understood to be at least similar to the first protrusion GA2_1.

The protrusions GA2_1 and GA2_2 of the segments SG2 may have different thicknesses. For example, the first protrusion GA2_1 may include a first depressed portion GA2_1a disposed at the opposite end in the second direction DR2 and a first flat portion GA2_1b disposed on one side of the first depressed portion GA2_1a in the second direction DR2. In this instance, the first protrusion GA2_1 of the segments SG2 has the minimum thickness GA2_1a_h at the first depressed portion GA2_1a, and has the maximum thickness GA2_1b_h at the first flat portion GA2_1b. The thickness GA2_1b_h of the segments SG2 at the first flat portion GA2_1b may be equal to the thickness SG2_h of the segments SG2 at the adhesive area AD. Accordingly, the first depressed portion GA2_1a and the first flat portion GA2_1b may have the step W2 in the third direction DR3 and accordingly may have a stair-like shape as shown in FIG. 13. For example, the step W2 in the third direction DR3 is equal to the difference between the thickness GA2_1a_h of the segments SG2 at the first protrusion GA2_1 and the thickness GA2_1b_h of the segments SG2 at the first flat portion GA2_1b.

A housing HA may be formed in the first depressed portion GA2_1a, where the bearing 3000 is disposed. The housing HA may be omitted from at the first flat portion GA2_1b. For example, the housing HA may overlap the first depressed portion GA2_1a but might not overlap the first flat portion GA2_1b.

The step W2 formed between the first depressed portion GA2_1a and the first flat portion GA2_1b may be substantially equal to the width W1 of the portion of the bearing 3000 in the third direction DR3 that is exposed from the first depressed portion GA2_1a of the protrusions GA2_1 and GA2_2. For example, although the bearing 3000 is exposed from the protrusions GA2_1 and GA2_2 and protrudes from the segments SG2 in the third direction DR3, the level difference can be offset by the step W2 formed between the first depressed portion GA2_1a and the first flat portion GA2_1b. For example, the sum of the width W1 in the third direction DR3 by which the bearing 3000 is exposed and the thickness GA2_1a_h of the segments SG2 at the first depressed portion GA2_1a may be substantially equal to the thickness GA2_1b_h of the segments SG2 at the first flat portion GA2_1b or the thickness SG2_h of the segments SG at the adhesive area AD.

FIG. 14 is a perspective view schematically showing an arrangement of a support module and bearings of a display device according to an embodiment. FIG. 15 is a plan view of the segments and the bearings of FIG. 14 viewed from the third direction. FIG. 16 is a plan view schematically showing the structure of the support module, the panel storage compartment and the bearings of FIG. 14.

According to the embodiment of FIGS. 14 to 16, bearings 3003 may be partially exposed from the upper surfaces, front surfaces and rear surfaces of a plurality of segments SG3 at the protrusions GA3_1 and GA3_2 of the plurality of segments SG3 in a display device 1_3. For example, the bearing 3003 may include a first bearing 3003_1 exposed from the upper surface of the segments SG3, and a second bearing 30032 exposed from the front surface of the segments SG3. Accordingly, the plurality of segments SG3 can reduce friction with the panel storage compartment SD on the front and upper surfaces.

Each of the protrusions GA3_1 and GA3_2 of the plurality of segments SG3 may include a first housing HA3_1 formed in the upper surface, and a second housing HA3_2 formed in the front surface or the rear surface. The first bearing 30031 is disposed in the first housing HA3_1, and the second bearing 3003_2 is disposed in the second housing HA3_2. The first housing HA3_1 and the second housing HA3_2 are not in contact with each other inside the protrusions GA3_1 and GA3_2. For example, the first housing HA3_1 and the second housing HA3_2 might not overlap each other inside the protrusions GA3_1 and GA3_2. Accordingly, the first bearing 3003_1 and the second bearing 3003_2 might not be in contact with each other inside the protrusions GA3_1 and GA3_2 as shown in FIG. 15. For example, the first bearing 3003_1 and the second bearing 30032 might not overlap each other inside the protrusions GA3_1 and GA3_2. As the first bearing 3003_1 and the second bearing 3003_2 are not in contact with each other, the plurality of segments SG3 can effectively prevent friction caused by the guide rails GR of the panel storage compartment SD.

FIG. 17 is a perspective view schematically showing an arrangement of a support module and bearings of a display device according to an embodiment. FIG. 18 is a plan view schematically showing the structure of the support module, the panel storage compartment and the bearings of FIG. 16.

A display device 1_4 according to the embodiment of FIGS. 17 and 18 is substantially identical to the display device 1 according to the embodiment of FIG. 1 except that the display device 1_4 further includes additional guide members 4004 that are formed on a part of the upper surfaces of the segments SG4 and protrude in the second direction DR2. The guide members 4004 may be engaged with guide rails GR of a panel storage compartment SD to assist the sliding behavior of a display panel PNL. The guide members 4004 may protrude in the second direction DR2 from a part of the upper surfaces of the plurality of segments SG4. For example, the guide members 4004 may overlap connection areas GA4_1 and GA4_2 of the plurality of segments SG in the third direction DR3 and protrude in the second direction DR2. The connection areas may be located at the opposite ends of each of the plurality of segments SG in the second direction DR2. The connection areas GA4_1 and GA4_2 may include a first connection area GA4_1 on the opposite side in the second direction DR2 and a second connection area GA4_2 on one side in the second direction DR2. An adhesive area AD may be disposed between the first connection area GA4_1 and the second connection area GA4_2. In some embodiments, the guide member 4004 may be formed integrally with each of the plurality of segments SG4, but the disclosure is not necessarily limited thereto. In some embodiments, the guide member 4004 may have, but is not necessarily limited to having, a cuboidal shape or a similar shape.

The guide member 4004 may include a first guide member 4004_1 formed on the opposite side of each of the plurality of segments SG4 in the second direction DR2, and a second guide member 4004_2 formed on one side of each of the plurality of segments SG4 in the second direction DR2. The first guide member 40041 may overlap the first connection area GA4_1 of each of the plurality of segments SG4, and the second guide member 40042 may overlap the second connection area GA4_2 of each of the plurality of segments SG4. Bearings 3000 are disposed in the first guide member 4004_1 and the second guide member 4004_2 formed on the upper surface of each of the plurality of segments SG4, so that it is possible to prevent the segments SG4 from being in direct contact with the panel storage compartment SD, and to reduce friction between the guide members 4004 and the panel storage compartment SD, as shown in FIG. 18.

One surface of the first guide member 4004_1 in the third direction DR3 may be the upper surface in which a housing HA for accommodating the bearing 3000 is formed. The opposite surface thereof in the third direction DR3 may be the lower surface opposite to the upper surface. In addition, one side surface of the first guide member 4004_1 in the second direction DR2 may be the front surface facing the panel storage compartment SD. Similarly, one surface of the second guide member 4004_2 in the third direction DR3 may be the upper surface in which a housing HA for accommodating the bearing 3000 is formed. The opposite surface thereof in the third direction DR3 may be the lower surface opposite to the upper surface. In addition, one side surface of the second guide member 4004_2 in the second direction DR2 may be the front surface facing the panel storage compartment SD.

The structures and shapes of the first guide member 4004_1 are substantially identical to those of the second guide member 4004_2 as described above. Therefore, the first guide member 4004_1 will be mainly described while the second guide member 4004_2 may be understood to be at least similar to the first guide member 4004_1.

FIG. 19 is a plan view schematically showing the structure of a support module, a panel storage compartment and bearings of a display device according to an embodiment.

A display device 1_5 according to the embodiment of FIG. 19 is different from the display device 1_4 according to the embodiment of FIG. 17 in that a bearing 3005 may penetrate guide members 4005 in the third direction DR3 to be exposed from upper and lower surfaces of the guide members 4005.

In the display device 1_5 according to this embodiment, the bearing 3005 penetrates the guide members 4005 in the third direction DR3, so that the panel storage compartment SD and the guide members 4005 are not in direct contact with each other. For example, when the guide members 4005 are engaged with the guide rails GR formed in the second storage compartment SD_2 and the third storage compartment SD_3, the bearings 3005 are partially exposed on the upper and lower surfaces of each of the guide members SG1. The bearings 3005 exposed on the upper and lower surfaces of each of the guide members SG1 are engaged with the guide rails GR, so that it is possible to prevent direct contact between the second storage compartment SD_2 and the upper and lower surfaces of the guide members 4005 and between the third storage compartment SD_3 and the upper and lower surfaces of the guide members 4005.

In some embodiments, the width (hereinafter referred to as thickness) of the guide members 4005 in the third direction DR3 may be smaller than the thickness of the guide members 4004 of the display device 1_4 according to the embodiment of FIG. 17. It should be understood, however, that the disclosure is not necessarily limited thereto.

FIG. 20 is a perspective view schematically showing an arrangement of a support module and bearings of a display device according to an embodiment. FIG. 21 is a plan view schematically showing the structure of the support module, the panel storage compartment and the bearings of FIG. 20.

A display device 1_6 according to the embodiment of FIGS. 20 and 21 is substantially identical to the display device 1_4 according to the embodiment of FIG. 17 except that bearings 3006 are exposed on the upper surface as well as the front surface of a guide member 4006. For example, the bearings 3006 may include a first bearing 3006_1 exposed from the upper surface of the guide member 4006, and a second bearing 30062 exposed from the front surface of the guide member 4006. Accordingly, the guide member 4006 can reduce friction with the panel storage compartment SD on the front and upper surfaces.

The guide member 4006 may include a first housing HA6_1 formed in the upper surface, and a second housing HA6_2 formed in the front surface. The first bearing 3006_1 is disposed in the first housing HA6_1, and the second bearing 30062 is disposed in the second housing HA6_2. The first housing HA6_1 and the second housing HA6_2 are not in contact with each other inside the guide member 4006. Accordingly, the first bearing 30061 and the second bearing 3006_2 might not be in contact with each other inside the guide member 4006 as shown in FIG. 15. Since the first bearing 30061 and the second bearing 3006_2 are not in contact with each other, the guide member 4006 can effectively prevent friction by the guide rails GR of the panel storage compartment SD.

FIG. 22 is a plan view schematically showing the structure of a display panel, a support module and bearings of a display device according to an embodiment. FIG. 23 is a plan view showing the behavior of a support module and bearings in a rounded area of a display device. FIG. 24 is a plan view schematically showing the display panel of FIG. 22. FIG. 25 is a plan view showing the support plate of FIG. 22 as viewed from the third direction. FIG. 26 is a perspective view schematically showing the arrangement structure of the support module and the bearings of FIG. 22. FIG. 27 is an exploded perspective view for illustrating the arrangement structure of the support plate, the segments and the bearings according to the embodiment of FIG. 22.

According to the embodiment of FIGS. 22 to 25, a support module 2007 of a display device 1_7 further includes a support plate 2407 on which a lattice pattern is formed, each of a plurality of segments SG7 has a shape in which the width of the upper surface is narrower than the width of the lower surface, and a bearing 3007 is disposed in a housing HA7 formed in a space defined by the support plate 2407 between adjacent two segments SG7.

For example, the support module 2007, according to this embodiment, may further include a support plate 2407 attached to the lower surface of the display panel PNL. The support plate 2407 supports the lower surface of the display panel PNL and may assist the sliding operation of the display panel PNL. The support plate 2407 may be disposed on the lower surface of the display panel PNL. In the example shown in FIG. 22, one surface of the support plate 2407 in the third direction DR3 may be the upper surface attached to the lower surface of the display panel PNL, and the opposite surface of the support plate 2407 in the third direction DR3 may be the lower surface where a second support member 2207 and a third support member 2307 are attached, which will be described later. Adhesive layer may be interposed between the display panel PNL and the support plate 2407 so that the display panel PNL and the support plate 2407 may be attached together. The support plate 2407 may be bent or slid inside the display device 1_7 according to the behavior of the display panel PNL. When the support plate 2407 is further included in the support module 2007, the elastic member EM (see FIG. 5) and the first support member 2100 (see FIG. 5) may be omitted. The support plate 2407 may be referred to as a first support member.

The support plate 2407 may include a metal such as a stainless steel, for example, SUS340 or a polymer material such as polyurethane. The support plate 2407 may have substantially the same width (hereinafter referred to as thickness) in the third direction DR3 along the profile of the display panel PNL. The support plate 2407 may have a relatively small thickness so that it can be bent according to the behavior of the display panel PNL. In some embodiments, the thickness of the support plate 2407 may range from 0.05 mm to 0.3 mm, but the disclosure is not necessarily limited thereto.

The support plate 2407 may include a flat support area 2417, a first pattern support area 2427 and a second pattern support area 2437. In the flat support area 2417 of the support plate 2407, no lattice pattern is formed. In each of the first pattern support area 2427 and the second pattern support area 2437, a lattice pattern is formed. The second pattern support area 2437 may be located on one side of the flat support area 2417 in the first direction DR1, and the first pattern support area 2427 may be located on the opposite side of the flat support area 2417 in the first direction DR1. For example, the flat support area 2417 of the support plate 2407 may be located between the first pattern support area 2427 and the second pattern support area 2437.

The support plate 2407 may have a constant thickness across different areas of the support plate 2407. For example, the thickness of the flat support area 2417 of the support plate 2407 may be equal to the thickness of the first pattern support area 2427 and the thickness of the second pattern support area 2437 of the support plate 2407.

The flat support area 2417 of the support plate 2407 can support a first area PNL_1 of the display panel PNL. The flat support area 2417 may be disposed on the lower surface of the first area PNL_1 of the display panel PNL. The shape of the flat support area 2417 may be substantially identical to the shape of the first area PNL_1 when viewed from the top. For example, the shape of the flat support area 2417 may be, but is not necessarily limited to being, a rectangle extended in the first direction DR1 and the second direction DR2 or a plane similar to a rectangle when viewed from the top.

The first pattern support area 2427 of the support plate 2407 may support a second area PNL_2 of the display panel PNL. The first pattern support area 2427 may be disposed on the lower surface of the second area PNL_2. The first pattern support area 2427 may be disposed on the opposite side of the flat support area 2417 in the first direction DR1. When the second area PNL_2 of the display panel PNL is bent at the first rounded area RA_1, the first pattern support area 2427 may be bent together with the second area PNL_2.

The second pattern support area 2437 of the support plate 2407 may support a third area PNL_3 of the display panel PNL. The second pattern support area 2437 may be disposed on the lower surface of the third area PNL_3. The second pattern support area 2437 may be disposed on one side of the flat support area 2417 in the first direction DR1. When the third area PNL_3 of the display panel PNL is bent at the second rounded area RA_2, the second pattern support area 2437 may be bent together with the third area PNL_3.

The first pattern support area 2427 and the second pattern support area 2437 of the support plate 2407 may include a plurality of attachment areas ADP and a plurality of segment attachment areas ADP. The plurality of attachment areas ADP and the plurality of segment attachment areas ADP may be arranged alternately. For example, each of the segment attachment areas ADP may be disposed between adjacent ones of the attachment areas ADP, and each of the attachment areas ADP may be disposed between adjacent ones of the segment attachment areas ADP. The attachment areas ADP can assist the first pattern support area 2427 and the second pattern support area 2437 to be bent. In each of the attachment areas ADP, a lattice pattern of slits SL is formed, which penetrate through the support plate 2407 in the third direction DR3 and are spaced apart from one another. In the segment attachment area ADP, the lattice pattern might not be formed.

Referring to FIG. 24, a part of the support plate 2407 may protrude on opposite sides of the display panel PNL in the second direction DR2 when viewed from the third direction DR3. For example, one side of the flat support area 2417 of the support plate 2407 in the second direction DR2 may protrude from one side of the display panel PNL in the second direction DR2. A part of the opposite sides of the segment attachment area ADP of the first pattern support area 2427 and the second pattern support area 2437 of the support plate 2407 in the second direction DR2 may protrude from the opposite sides of the display panel PNL in the second direction DR2. The opposite ends of the segment attachment area ADP protruding from the opposite sides of the display panel PNL in the second direction DR2 may have a T-shape when viewed from the third direction DR3. Hereinafter, the shape of the attachment areas ADP and the shape of the segment attachment areas ADP will be described in detail.

The lattice pattern may include a plurality of slits SL. The slits SL may include a first slit SL_1, a second slit SL_2 and a third slit SL_3. The first slit SL_1, the second slit SL_2 and the third slit SL_3 may be spaced apart from one another. The first slit SL_1 may be a rectangular slit having the shorter sides extended in the first direction DR1 and the longer sides extended in the second direction DR2. The second slit SL_2 and the third slit SL_3 may have spaces to accommodate the bearings 3000. The second slit SL_2 may be located on the opposite side of the lattice pattern in the second direction DR2, while the third slit SL_3 may be located on one side of the lattice pattern in the second direction DR2. They may be symmetrical to each other.

Referring to FIG. 25, the width of the first slit SL_1 in the first direction DR1 may be smaller than the width in the second direction DR2. A plurality of first slits SL_1 may be formed in a single attachment area ADP.

The second slit SL_2 may include, but is not necessarily limited to including, a first protrusion SL_2a, a second protrusion SL_2b, a central portion SL_2c and a third protrusion SL_2d. In the following description, the second slit SL_2 includes the first protrusion SL_2a, the second protrusion SL_2b, the central portion SL_2c and the third protrusion SL_2d for convenience of illustration. The second slit SL_2 may have a U-shape rotated by 90° clockwise. The central portion SL_2c may be a space where the bearing 3007 can be accommodated as described above. In some embodiments, the central portion SL_2c may have, but is not necessarily limited to having, a rectangular shape having the longer sides extended in the first direction DR1 and the shorter sides extended in the second direction DR2 or a shape similar to it. For example, the central portion SL_2c may have a circular shape having a certain diameter or a shape similar to it. The width of the central portion SL_2c in the first direction DR1 or the width in the second direction DR2 may be greater than the diameter of the bearing 3007, and the thickness of the support plate 2407 may be smaller than the diameter of the bearing 3007. Accordingly, the bearing 3007 may be stably accommodated in the central portion SL_2c and exposed from the upper surface of the support plate 2407.

Pillar portions ADPc of the segment attachment areas ADP, to be described later, may be partially disposed on opposite sides of the central portion SL_2c in the first direction DR1. The first protrusion SL_2a extended in the second direction DR2 may be disposed at the opposite end of the central portion SL_2c in the first direction DR1. The width of the first protrusion SL_2a in the first direction DR1 may be smaller than the width of the first protrusion SL_2a in the second direction DR2. In some embodiments, the width of the first protrusion SL_2a in the first direction DR1 may be substantially equal to the width of the first slit SL_1 in the first direction DR1. It should be understood, however, that the disclosure is not necessarily limited thereto. The second protrusion SL_2b extended in the second direction DR2 may be disposed at one end of the central portion SL_2c in the first direction DR1. The width of the second protrusion SL_2b in the first direction DR1 may be smaller than the width of the second protrusion SL_2b in the second direction DR2. In some embodiments, the width of the second protrusion SL_2b in the first direction DR1 may be substantially equal to the width of the first slit SL_1 in the first direction DR1. It should be understood, however, that the disclosure is not necessarily limited thereto. The third protrusion SL_2d protruding on the opposite side in the second direction DR2 may be disposed at the center of the central portion SL_2c in the first direction DR1. The third protrusion SL_2d may be located between the protrusions ADPa of two adjacent segment attachment areas ADP among the plurality of segment attachment areas ADP, as will be described later. The width of the third protrusion SL_2d in the first direction DR1 may be substantially equal to the width of the first slit SL_1 in the first direction DR1, the width of the first protrusion SL_2a in the first direction DR1, and the width of the second protrusion SL_2b in the first direction DR1. The width of the third protrusion SL_2d in the second direction DR2 may be smaller than the width of the first protrusion SL_2a and the second protrusion SL_2b in the second direction DR2 The width of the third protrusion SL_2d in the first direction DR1 may be smaller than the diameter of the bearing 3000.

The third slit SL_3 may include a first protrusion SL_3a, a second protrusion SL_3b, a central portion SL_3c and a third protrusion SL_3d. The central portion SL_3c may be a space where a bearing 3007 can be accommodated as described above. The shape of the third slit SL_3 is substantially identical to that of the second slit SL_2 except that it is symmetrical.

The first slits SL_1 may be spaced apart from the first protrusions SL_2a and SL_3a, the second protrusions SL_2b and SL_3b and the third protrusions SL_2d and SL_3d of the second slit SL_2 and the third slit SL_3 in the second direction DR2 and may be arranged in line with them. For example, a first slit SL_1 may be disposed in the direction parallel to the straight line in the second direction DR2 passing through the first protrusions SL_2a and SL_3a of the second slit SL_2 and the third slit SL_3 between the first protrusion SL_2a of the second slit SL_2 and the first protrusion SL_3a of the third slit SL_3. A first slit SL_1 may be disposed in the direction parallel to the straight line in the second direction DR2 passing through the second protrusions SL_2b and SL_3b of the second slit SL_2 and the third slit SL_3 between the second protrusion SL_2b of the second slit SL_2 and the second protrusion SL_3b of the third slit SL_3. A first slit SL_1 may be disposed in the direction parallel to the straight line in the second direction DR2 passing through the third protrusions SL_2d and SL_3d of the second slit SL_2 and the third slit SL_3 between the central portion SL_2c of the second slit SL_2 and the central portion SL_3c of the third slit SL_3. Accordingly, the width of the slits SL of the lattice pattern may be constant when the first pattern support area 2427 and the second pattern support area 2437 are not bent, while the width of the slits SL may increase when the first pattern support area 2427 and the second pattern support area 2437 are bent. For example, when the first pattern support area 2427 and the second pattern support area 2437 are bent, the width of the slits SL increases to increase the first pattern support area 2427 and the second pattern support area 2437. Therefore, it is possible to facilitate bending of the first pattern support area 2427 and the second pattern support area 2437.

The segment attachment areas ADP may provide spaces on the lower surfaces of the first pattern support area 2427 and the second pattern support area 2427 where the segments SG7 of the second support member 2207 and the third support member 2307 are attached, which will be described later. Since the slits SL are not disposed in the segment attachment areas ADP, they may have a flat plate shape.

The segment attachment areas ADP may have an I-shape rotated by 90° clockwise. Each of the segment attachment areas ADP may include a first anti-deviation portion ADPa disposed at the opposite end in the second direction DR2, a second anti-deviation portion ADPb disposed at one end in the second direction DR2, and a pillar portion ADPc disposed between the first anti-deviation portion ADPa and the second anti-deviation portion ADPb.

The pillar portion ADPc may provide most of the area where a contact portion SG7a of each of the segments SG, which will be described later, is attached to the support plate 2407. In some embodiments, the pillar portion ADPc may have, but is not necessarily limited to having, a rectangular shape or a similar shape. The first anti-deviation portion ADPa may be disposed on the opposite side of the pillar portion ADPc in the second direction DR2, and the second anti-deviation portion ADPb may be disposed on one side in the second direction DR2.

The first anti-deviation portion ADPa can prevent the bearing 3007 from being deviated. The width of the first anti-deviation portion ADPa in the first direction DR1 may be greater than the width of the pillar portion ADPc in the first direction DR1, and the first anti-deviation portion ADPa may be disposed such that it protrudes in the first direction DR1 from the pillar portion ADPc.

The second anti-deviation portion ADPb can prevent the bearing 3007 from being deviated. The width of the second anti-deviation portion ADPb in the first direction DR1 may be greater than the width of the pillar portion ADPc in the first direction DR1, and the second anti-deviation portion ADPb may be disposed such that it protrudes in the first direction DR1 from the pillar portion ADPc.

The third protrusions SL_2d and SL_3d of the second slit SL_2 and the third slit SL_3 described above may be formed by the first anti-deviation portion ADPa and the second anti-deviation portion ADPb of two adjacent segment attachment areas ADP. For example, the first anti-deviation portion ADPa of the segment attachment area ADP may block a part of the central portion SL_2c of the second slit SL_2 on the opposite side in the second direction DR2. The second anti-deviation portion ADPb of the segment attachment area ADP may block a part of the central portion SL_3c of the third slit SL_3 on one side in the second direction DR2. Accordingly, the third protrusions SL_2d and SL_3d of the second slit SL_2 and the third slit SL_3 may be formed. Since the width of the third protrusions SL_2d and SL_3d of the second slit SL_2 and the third slit SL_3 in the first direction DR1 is smaller than the diameter of the bearings 3007, it is possible to prevent the bearings 3007 from being deviated from the central portions SL_2c and SL_3c of the second slit SL_2 and the third slit SL_3.

The second support member 2207 may support the first pattern support area 2427 of the support plate 2407. The second support member 2207 may be attached to the segment attachment area ADP of the first pattern support area 2427. The second support member 2207 may overlap the second area PNL_2 of the display panel PNL in the third direction DR3.

The third support member 2307 may support the second pattern support area 2437 of the support plate 2407. The third support member 2307 may be attached to the segment attachment area ADP of the second pattern support area 2437. The third support member 2307 may overlap the third area PNL_3 of the display panel PNL in the third direction DR3.

Each of the segments SG7 may include a contact portion SG7a in direct contact with the lower surface of the segment attachment area ADP of the first pattern support area 2427 and the second pattern support area 2437, and a body portion SG7b disposed under the contact portion SG7a. The contact portion SG7a may be adjacent to each of the segment attachment areas ADP of the first pattern support area 2427 and the second pattern support area 2437. The segments SG7 may be disposed such that they do not overlap with the lattice pattern areas LAP and instead overlap with the segment attachment areas ADP in the third direction DR3. The contact portion SG7a and the body portion SG7b may be formed integrally (e.g., as a singular undivided unit). The contact portion SG7a may be used to attach the segments SG7 to the support plate 2407. The body portion SG7b can reinforce the strength of the segments SG7.

The width of the segments SG7 may be discontinuously changed along the third direction DR3, i.e., in the direction toward the inside of the display device 1_7. For example, the width SGa_w of the contact portion SG7a in the first direction DR1 may be smaller than the width SGb_w of the body portion SG7b in the first direction DR1. The width of the segment attachment area ADP in the first direction DR1 where the contact portion SG7a is attached may be substantially equal to the width SGa_w of the contact portion SG7a in the first direction DR1. In some embodiments, the width SGa_w of the contact portion SG7a in the first direction DR1 may range, but is not necessarily limited to, from 0.2 mm to 1.5 mm. In some embodiments, the contact portion SG7a has a rectangular shape having a width in the first direction DR1 when viewed from the top, the body portion SG7b has a rectangular shape having a width in the first direction DR1 when viewed from the top, and the contact portion SG7a protrudes from the center of the body portion SG7b in the third direction DR3, as shown in FIG. 22. It should be understood, however, that the disclosure is not necessarily limited thereto. For example, the segments SG7 may have, but is not necessarily limited to having, an inverted T-shape when viewed from the top.

Referring to FIG. 22, one end face of the segment SG7 in the third direction DR3 may be the upper surface in direct contact with the lower surface of the segment attachment area ADP of the support plate 2407, while the opposite end face thereof in the third direction DR3 may be the lower surface opposed to the lower surface in the third direction DR3. For example, the upper surface of the segments SG7 may be identical to one side surface (hereinafter referred to as upper surface) of the contact portion SG7a in the third direction DR3, while the lower surface of the segments SG7 may be identical to the opposite side surface (hereinafter referred to as lower surface) of the body portion SG7b in the third direction DR3. The segments SG may include a metal such as SUS304.

The plurality of segments SG7 may be arranged such that they are spaced apart from one another at a predetermined distance in the first direction DR1 as described above. The distance between the segments SG7 may be different at different portions of the segments SG7. For example, the distance between the body portions SG7b of two adjacent segments SG7 may be smaller than the distance between the attachment portions SG7a of the two adjacent segments SG7 among the plurality of segments SG7.

As the segments SG7 has the above-described shape, the width of the contact portion SG7a of the segments SG7 in the first direction DR1 is formed to be relatively narrow, and thus the width of the segment attachment areas ADP decreases while the width of the lattice pattern areas LAP decreases in the first direction DR1. Accordingly, the lattice pattern areas LAP become larger in the first pattern support area 2427 and the second pattern support area 2437 of the support plate 2407, and thus the first pattern support area 2427 and the second pattern support area 2437 can be bent more effectively. As a result, the display panel PNL can be more easily bent in the rounded area RA, so that a stress applied to the display panel PNL can be reduced and the reliability of the display device 1_7 can be increased. In addition, as the width of the body portion SG7b of the segments SG7 is relatively wide in the first direction DR1, it is possible to supplement insufficient strength of the contact portion SG7a having a relatively narrow width in the first direction DR1. As a result, the segments SG7 can effectively support the display panel PNL. In addition, as the width of the contact portion SG7a of the segments SG7 is relatively narrow, the distance between the contact portions SG7a of the two adjacent segments SG7 is formed relatively large, while the distance between the body portions SG7b of the two adjacent segments SG7 is formed relatively small. Accordingly, the housing HA7 that is the space in which the bearing 3007 can be accommodated may be defined between the lattice pattern of the support plate 2407 and the contact portions SG7a and the body portions SG7b of the two adjacent segments SG. For example, the housing HA7 may be a part of the space between the contact portions SG7a and the body portions SG7b of two adjacent segments SG7 that overlaps with the central portions SL_2c and SL_3c of the second slit SL_2 and the third slit SL_3.

Incidentally, the distance between the body portions SG7b of two adjacent segments SG7 among the plurality of segments SG7 may become smaller in the rounded area RA in which the display panel PNL is bent than in the planar area PA, as shown in FIG. 23.

Hereinafter, the structure in which the bearing 3000 is disposed in the housing HA7 formed between the support plate 2407 and two adjacent segments SG7 will be described in detail.

Referring to FIGS. 26 and 27, the plurality of segments SG7 may include a first segment SG7_1 and a second segment SG7_2. The second segment SG7_2 may be adjacent to the first segment SG7_1. The plurality of segments SG7 may have a structure in which the first segment SG7_1 and the second segment SG7_2 are repeatedly arranged. The upper surface of the first segment SG7_1 may be attached to the first segment attachment area ADP_1, and the upper surface of the second segment SG7_2 may be attached to the second segment attachment area ADP_2. The lattice pattern area LAP may be disposed between the first segment attachment area ADP_1 and the second segment attachment area ADP_2.

The bearing 3007 may be accommodated in the housing HA7 formed in the space between the contact portion SG7a of the first segment SG7_1 and the contact portion SG7a of the second segment SG7_2, and in the central portion SL_2c of the second slit SL_2 or the central portion SL_3c of the third slit SL_3. For example, the opposite side surfaces of the housing HA7 in the first direction DR1 and the second direction DR2 may be defined by the contact portion SG7a of the first segment SG7_1 and the attachment portion SG7b of the second segment SG7_2. One side surface of the housing HA7 in the third direction DR3 may be defined by the central portion SL_2c of the second slit SL_2 or the central portion SL_3c of the third slit SL_3. The opposite surface of the housing HA7 in the third direction DR3 may be defined by the body portion SG7_1b of the first segment SG7_1 and the body portion SG7_2b of the second segment SG7_2.

Since the bearing 3007 is accommodated in the central portions SL_2c and SL_3c of the second slit SL_2 and the third slit SL_3 and exposed from the upper surface of the support plate 2407, it may be engaged with a guide rail SD of the panel storage compartment SD.

It is possible to prevent the bearing 3007 from being deviated from the housing HA7 on the opposite side in the third direction DR3 by the body portion SG7b of the first segment SG7_1 and the body portion SG7b of the second segment SG7_2. In addition, it is possible to prevent the bearing 3007 from being deviated in the second direction DR2 by the first anti-deviation portions ADP_1a and ADP_2a of the first segment attachment areas ADP_1 and the second segment attachment areas ADP_2.

Those skilled in the art will appreciate that many variations and modifications can be made to the embodiments described herein without substantially departing from the principles of the present disclosure.

What is claimed is:

1. A display device, comprising:
a display panel configured to slide in a first direction;
a panel storage compartment configured to accommodate the display panel therein and to assist a sliding operation of the display panel in the first direction;
a support attached to a lower surface of the display panel;
a first plurality of segments attached to the lower surface of the display panel on a first side of the support, each of the first plurality of segments extended in a second direction intersecting the first direction, and spaced apart from one another in the first direction;
a second plurality of segments attached to the lower surface of the display panel on a second side of the support opposite to the first side of the support, each of the second plurality of segments extending in the second direction and spaced apart from one another in the first direction, and
bearings disposed inside each of the first plurality of segments and second plurality of segments and at least partially exposed by the first and second pluralities of segments,
wherein the panel storage compartment comprises guide rails that are engaged with the bearings.

2. The display device of claim 1,
wherein each of the first and second pluralities of segments includes a housing accommodating the bearings, and
wherein the bearings are exposed by upper surfaces of the first and second pluralities of segments.

3. The display device of claim 2,
wherein the bearings penetrate through the first and second pluralities of segments and are exposed by the upper surfaces of the first and second pluralities of segments and lower surfaces of the first and second pluralities of segments that are opposed to the upper surfaces.

4. The display device of claim 2,
wherein each of the bearings has a spherical shape, and
wherein a diameter of each of the bearings is smaller than a width of each of the housings.

5. The display device of claim 1,
wherein each of the first and second pluralities of segments comprises protrusions on opposite sides of the display panel in the second direction and including the housings where the bearings are accommodated, and
wherein the guide rails of the panel storage compartment engage with the protrusions and the bearings.

6. The display device of claim 5,
wherein the bearings comprise a first bearing and a second bearing,
wherein the housings comprise a first housing accommodating the first bearing and a second housing accommodating the second bearing,
wherein the first bearing is exposed by upper surface of each of the first and second pluralities of segments and the second bearing is exposed by a front surface of each of the first and second pluralities of segments at the protrusions, and
wherein the upper surface and the front surface of each of the first and second pluralities of segments face the panel storage compartment on the guide rails.

7. The display device of claim 6,
wherein the first bearing and the second bearing do not overlap each other.

8. The display device of claim 5,
wherein each of the plurality of segments comprises a depressed portion having a minimum thickness and a flat portion having a maximum thickness at the protrusions, and
wherein each of the housings overlaps the depressed portion but does not overlap the flat portion.

9. The display device of claim 8,
wherein the depressed portion and the flat portion have a step in a third direction that is perpendicular to the first direction and the second direction, and
wherein a height of the step is substantially equal to a width by which the bearings are exposed in the third direction.

10. A panel support, comprising:
a first support extended in a first direction and a second direction intersecting the first direction;
a second support disposed adjacent to the first support on a first side thereof, extended in the second direction and comprising a first segment and a second segment that are spaced apart from each other in the first direction;
a third support disposed adjacent to the first support on a second side thereof opposite to the first side thereof, extending in the second direction and comprising a first segment and a second segment that are spaced apart from each other in the first direction; and
bearings accommodated at both ends of each of the first segment and the second segment of each of the second support and the third support in the second direction, each of the bearings being at least partially exposed.

11. The panel support of claim 10,
wherein each of the first segment and the second segment of each of the second support and the third support comprises a housing where the bearings are accommodated at opposite ends in the second direction.

12. The panel support of claim 10,
wherein the first support comprises a flat support area having a flat plate shape and a first pattern support area disposed on one side of the flat support area in the first direction,
wherein the first pattern support area comprises lattice patterns formed at both ends of the first pattern support area in the second direction, wherein slits penetrating through the first support are arranged alternately and/or repeatedly in the lattice pattern,
wherein the first segment and the second segment of each of the second support and the third support are attached to a lower surface of the first pattern support area with the slits disposed therebetween, and
wherein each of the bearings is accommodated in a housing formed with a space between the first segment and the second segment of each of the second support and the third support and the slits.

13. The panel support of claim 10:
wherein the first segment of the second support is one of a plurality of first segments of the second support,
wherein the first segment of the third support is one of a plurality of first segments of the third support,
wherein the second segment of the second support is one of a plurality of second segments of the second support,
wherein the second segment of the third support is one of a plurality of second segments of the third support,
wherein the first segments of the second support are alternately arranged with the second segments of the second support, within the second support, the first segments of the second support are repeatedly arranged within the second support, and/or the second segments of the second support are repeatedly arranged within the second support, and
wherein the first segments of the third support are alternately arranged with the second segments of the third support, within the third support, the first segments of the third support are repeatedly arranged within the third support, and/or the second segments of the third support are repeatedly arranged within the third support.

* * * * *